United States Patent
Sanchez

(10) Patent No.: US 12,413,163 B2
(45) Date of Patent: *Sep. 9, 2025

(54) HARVESTING ENERGY FOR A SMART RING VIA PIEZOELECTRIC CHARGING

(71) Applicant: QUANATA, LLC, San Francisco, CA (US)

(72) Inventor: Kenneth Jason Sanchez, San Francisco, CA (US)

(73) Assignee: QUANATA, LLC, San Francisco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/594,294

(22) Filed: Mar. 4, 2024

(65) Prior Publication Data
US 2024/0250622 A1 Jul. 25, 2024

Related U.S. Application Data

(63) Continuation of application No. 18/187,745, filed on Mar. 22, 2023, now Pat. No. 11,923,791, which is a (Continued)

(51) Int. Cl.
*H01M 10/44* (2006.01)
*A44C 9/00* (2006.01)
(Continued)

(52) U.S. Cl.
CPC ............ *H02N 2/188* (2013.01); *A44C 9/0053* (2013.01); *H02J 7/007* (2013.01); *H02J 50/001* (2020.01);
(Continued)

(58) Field of Classification Search
CPC ........ H02J 7/007; H02J 7/0042; H02J 50/001; H02J 50/005; H02J 50/10; H02N 2/188;
(Continued)

(56) References Cited

U.S. PATENT DOCUMENTS

| 513,344 A | 1/1894 | Smith |
| 2,737,192 A | 3/1956 | Bieler |

(Continued)

FOREIGN PATENT DOCUMENTS

| CN | 103109462 A | 5/2013 |
| CN | 104799509 | 7/2015 |

(Continued)

OTHER PUBLICATIONS

"How to find your ideal bedtime with the Oura app", available online at <https://web.archive.org/web/20191206205332/https://ouraring.com/how-find-your-ideal-bedtime-with-the-oura-app/>, 2019, 8 pages. 2019.

(Continued)

*Primary Examiner* — Edward Tso
(74) *Attorney, Agent, or Firm* — BRYAN CAVE LEIGHTON PAISNER LLP

(57) ABSTRACT

A smart ring includes a housing configured to be worn by a user. The smart ring can further include a power source disposed within the housing. The smart ring also can include a charging circuit disposed within the housing. The charging circuit can include a harvesting element configured to charge the power source. The harvesting element can be configured to convert mechanical energy to electrical energy. The smart ring also can include a device at least partially disposed within the housing. The device can be configured to draw energy from the power source. Other embodiments are disclosed.

20 Claims, 7 Drawing Sheets

Related U.S. Application Data continuation of application No. 16/926,270, filed on Jul. 10, 2020, now Pat. No. 11,637,511.

(51) Int. Cl.

| | |
|---|---|
| *H01M 10/46* | (2006.01) |
| *H02J 7/00* | (2006.01) |
| *H02J 50/00* | (2016.01) |
| *H02J 50/10* | (2016.01) |
| *H02K 11/049* | (2016.01) |
| *H02K 11/05* | (2016.01) |
| *H02K 35/02* | (2006.01) |
| *H02N 2/18* | (2006.01) |
| *H10N 30/30* | (2023.01) |

(52) U.S. Cl.
CPC ............ *H02J 50/10* (2016.02); *H02K 11/049* (2016.01); *H02K 11/05* (2016.01); *H02K 35/02* (2013.01); *H02N 2/181* (2013.01); *H10N 30/306* (2023.02)

(58) Field of Classification Search
CPC ...... H02N 2/181; H02N 30/306; H02K 11/05; H02K 35/02; H02K 11/049; A44C 9/0053
USPC .................. 320/101, 107, 108, 114, 115
See application file for complete search history.

(56) References Cited

U.S. PATENT DOCUMENTS

| | | | |
|---|---|---|---|
| 3,792,192 | A | 2/1974 | Plate |
| 4,012,629 | A | 3/1977 | Simms |
| 4,382,112 | A | 5/1983 | Betts et al. |
| 4,684,687 | A | 8/1987 | Breach et al. |
| 4,830,014 | A | 5/1989 | Goodman et al. |
| 4,880,304 | A | 11/1989 | Jaeb et al. |
| 5,135,220 | A | 8/1992 | Baldoni |
| 6,097,480 | A | 8/2000 | Kaplan |
| 6,154,658 | A | 11/2000 | Caci |
| 6,201,698 | B1 | 3/2001 | Hunter |
| 6,560,993 | B1 | 5/2003 | Bosque et al. |
| 6,608,562 | B1 | 8/2003 | Kimura et al. |
| 6,699,199 | B2 | 3/2004 | Asada et al. |
| 6,745,061 | B1 | 6/2004 | Hicks et al. |
| 6,792,044 | B2 | 9/2004 | Peng et al. |
| 6,800,693 | B2 | 10/2004 | Nishihara et al. |
| 6,803,391 | B2 | 10/2004 | Paglia et al. |
| 6,805,140 | B2 | 10/2004 | Velez, Jr. et al. |
| 6,894,628 | B2 | 5/2005 | Marpe et al. |
| 6,909,753 | B2 | 6/2005 | Meehan et al. |
| 6,959,116 | B2 | 10/2005 | Sezer et al. |
| 7,013,674 | B2 | 3/2006 | Kretchmer |
| 7,136,532 | B2 | 11/2006 | VanDer |
| 7,190,986 | B1 | 3/2007 | Hannula et al. |
| 7,227,894 | B2 | 6/2007 | Lin et al. |
| 7,275,172 | B2 | 9/2007 | Janzen |
| 7,286,710 | B2 | 10/2007 | Marpe et al. |
| 7,468,036 | B1 | 12/2008 | Rulkov et al. |
| 7,500,746 | B1 | 3/2009 | Howell et al. |
| 7,519,229 | B2 | 4/2009 | Wallace et al. |
| 7,689,437 | B1 | 3/2010 | Teller et al. |
| 7,872,444 | B2 | 1/2011 | Hamilton et al. |
| 8,031,172 | B2 | 10/2011 | Kruse et al. |
| 8,075,484 | B2 | 12/2011 | Moore-Ede |
| 8,345,752 | B2 | 1/2013 | Lee et al. |
| 8,446,275 | B2 | 5/2013 | Utter, II |
| 8,554,297 | B2 | 10/2013 | Moon et al. |
| 8,570,273 | B1 | 10/2013 | Smith |
| 8,700,111 | B2 | 4/2014 | Leboeuf et al. |
| 8,954,135 | B2 | 2/2015 | Yuen et al. |
| 9,218,058 | B2 | 12/2015 | Bress et al. |
| 9,248,839 | B1 | 2/2016 | Tan |
| 9,248,938 | B2 | 2/2016 | Hopps |
| 9,265,310 | B2 | 2/2016 | Lam |
| 9,362,775 | B1 | 6/2016 | Jacobs |
| 9,420,260 | B2 | 8/2016 | McGregor et al. |
| 9,440,657 | B1 | 9/2016 | Fields et al. |
| 9,477,146 | B2 | 10/2016 | Xu et al. |
| 9,509,170 | B2 | 11/2016 | Wu |
| 9,628,707 | B2 | 4/2017 | Blum et al. |
| 9,660,488 | B2 | 5/2017 | Breedvelt-Schouten et al. |
| 9,696,690 | B2 | 7/2017 | Nguyen et al. |
| 9,711,060 | B1 | 7/2017 | Lusted et al. |
| 9,711,993 | B2 | 7/2017 | Kim |
| 9,717,949 | B1 | 8/2017 | Tran et al. |
| 9,756,301 | B2 | 9/2017 | Li et al. |
| 9,841,331 | B2 | 12/2017 | Wood et al. |
| 9,847,020 | B2 | 12/2017 | Davis |
| 9,861,314 | B2 | 1/2018 | Haverinen et al. |
| 9,908,530 | B1 | 3/2018 | Fields et al. |
| 9,931,976 | B1 | 4/2018 | Terwilliger et al. |
| 9,955,286 | B2 | 4/2018 | Segal |
| 9,956,963 | B2 | 5/2018 | Vijaya Kumar et al. |
| 9,965,761 | B2 | 5/2018 | Elangovan et al. |
| 10,007,355 | B2 | 6/2018 | Schorsch et al. |
| 10,085,695 | B2 | 10/2018 | Ouwerkerk et al. |
| 10,099,608 | B2 | 10/2018 | Cuddihy et al. |
| 10,102,510 | B2 | 10/2018 | Yau et al. |
| 10,137,777 | B2 | 11/2018 | Lu et al. |
| 10,139,859 | B2 | 11/2018 | Von Badinski et al. |
| 10,281,953 | B2 | 5/2019 | Von Badinski |
| 10,303,867 | B2 | 5/2019 | Schröder |
| 10,315,557 | B2 | 6/2019 | Terwilliger et al. |
| 10,317,940 | B2 | 6/2019 | Eim et al. |
| 10,345,506 | B1 | 7/2019 | Lyu |
| 10,359,846 | B2 | 7/2019 | Priyantha et al. |
| 10,366,220 | B2 | 7/2019 | Shapiro et al. |
| 10,377,386 | B2 | 8/2019 | Richmond |
| 10,396,584 | B2 | 8/2019 | Madau et al. |
| 10,409,327 | B2 | 9/2019 | Stotler |
| 10,444,834 | B2 | 10/2019 | Vescovi et al. |
| 10,463,141 | B2 | 11/2019 | Fitzgerald et al. |
| 10,528,989 | B1 | 1/2020 | Irey |
| 10,564,628 | B2 | 2/2020 | Hargovan et al. |
| 10,629,175 | B2 | 4/2020 | Yan et al. |
| 10,664,842 | B1 | 5/2020 | Bermudez et al. |
| 10,693,872 | B1 | 6/2020 | Larson et al. |
| 10,703,204 | B2 | 7/2020 | Hassan et al. |
| 10,709,339 | B1 | 7/2020 | Lusted |
| 10,745,032 | B2 | 8/2020 | Scheggi |
| 10,762,183 | B1 | 9/2020 | Charan et al. |
| 10,768,666 | B2 | 9/2020 | Von Badinski et al. |
| 10,838,499 | B2 | 11/2020 | Wang |
| 10,842,429 | B2 | 11/2020 | Kinnunen et al. |
| 10,849,557 | B2 | 12/2020 | Keating et al. |
| 10,893,833 | B2 | 1/2021 | Haverinen et al. |
| 10,944,745 | B2 | 3/2021 | Kursun et al. |
| 11,227,060 | B1 | 1/2022 | John et al. |
| 11,265,635 | B2 | 3/2022 | Shankar |
| 11,312,299 | B1 | 4/2022 | Assam |
| 11,479,258 | B1 | 10/2022 | Sanchez |
| 11,599,147 | B2 | 3/2023 | Von Badinski et al. |
| 11,637,511 | B2 * | 4/2023 | Sanchez .................. H02N 2/18 320/107 |
| 11,868,178 | B2 | 1/2024 | Von Badinski et al. |
| 11,868,179 | B2 | 1/2024 | Von Badinski et al. |
| 11,894,704 | B2 | 2/2024 | Sanchez |
| 11,909,238 | B1 | 2/2024 | Sanchez |
| 11,923,791 | B2 * | 3/2024 | Sanchez .................. H02J 7/007 |
| 11,984,742 | B2 | 5/2024 | Sanchez |
| 12,191,692 | B2 | 1/2025 | Sanchez |
| 12,211,467 | B2 | 1/2025 | Sanchez |
| 12,237,700 | B2 | 2/2025 | Sanchez et al. |
| 2002/0042464 | A1 | 4/2002 | Barclay et al. |
| 2002/0091568 | A1 | 7/2002 | Kraft et al. |
| 2002/0121831 | A1 | 9/2002 | Egawa et al. |
| 2003/0077064 | A1 | 4/2003 | Katayama |
| 2003/0142065 | A1 | 7/2003 | Pahlavan |
| 2004/0102551 | A1 | 5/2004 | Sato et al. |
| 2004/0118592 | A1 | 6/2004 | Pehlert |
| 2004/0145256 | A1 | 7/2004 | Miekka et al. |
| 2004/0160635 | A1 | 8/2004 | Ikeda et al. |
| 2004/0200235 | A1 | 10/2004 | Kretchmer |

(56) References Cited

U.S. PATENT DOCUMENTS

| | | |
|---|---|---|
| 2005/0012648 A1 | 1/2005 | Marpe et al. |
| 2005/0030205 A1 | 2/2005 | Konoshima et al. |
| 2005/0054941 A1 | 3/2005 | Ting et al. |
| 2005/0062454 A1 | 3/2005 | Raghunath et al. |
| 2005/0133248 A1 | 6/2005 | Easter |
| 2005/0162523 A1 | 7/2005 | Darrell et al. |
| 2005/0185060 A1 | 8/2005 | Neven, Sr. |
| 2005/0185843 A1 | 8/2005 | Kudoh |
| 2005/0185844 A1 | 8/2005 | Ono et al. |
| 2005/0230596 A1 | 10/2005 | Howell et al. |
| 2006/0002607 A1 | 1/2006 | Boncyk et al. |
| 2006/0069681 A1 | 3/2006 | Lauper |
| 2006/0080286 A1 | 4/2006 | Svendsen |
| 2006/0085477 A1 | 4/2006 | Phillips et al. |
| 2006/0089792 A1 | 4/2006 | Manber et al. |
| 2006/0211924 A1 | 9/2006 | Dalke et al. |
| 2006/0250043 A1 | 11/2006 | Chung |
| 2006/0271593 A1 | 11/2006 | De Mes et al. |
| 2007/0149222 A1 | 6/2007 | Hodko et al. |
| 2007/0159522 A1 | 7/2007 | Neven |
| 2007/0188626 A1 | 8/2007 | Squilla et al. |
| 2007/0200713 A1 | 8/2007 | Weber et al. |
| 2007/0223826 A1 | 9/2007 | Ridge et al. |
| 2008/0068559 A1 | 3/2008 | Howell et al. |
| 2008/0136587 A1 | 6/2008 | Orr |
| 2008/0174676 A1 | 7/2008 | Squilla et al. |
| 2008/0218684 A1 | 9/2008 | Howell et al. |
| 2008/0275309 A1 | 11/2008 | Stivoric et al. |
| 2009/0056703 A1 | 3/2009 | Mills et al. |
| 2010/0219989 A1 | 9/2010 | Asami et al. |
| 2011/0007035 A1 | 1/2011 | Shai |
| 2011/0080339 A1 | 4/2011 | Sun et al. |
| 2011/0224875 A1 | 9/2011 | Cuddihy et al. |
| 2012/0016245 A1 | 1/2012 | Niwa et al. |
| 2012/0130203 A1 | 5/2012 | Stergiou et al. |
| 2012/0184367 A1 | 7/2012 | Parrott et al. |
| 2012/0218184 A1 | 8/2012 | Wissmar |
| 2012/0293107 A1 | 11/2012 | Ajagbe |
| 2012/0317024 A1 | 12/2012 | Rahman et al. |
| 2013/0106603 A1 | 5/2013 | Weast et al. |
| 2013/0211291 A1 | 8/2013 | Tran |
| 2013/0335213 A1 | 12/2013 | Sherony et al. |
| 2014/0107493 A1 | 4/2014 | Yuen et al. |
| 2014/0118704 A1 | 5/2014 | Duelli et al. |
| 2014/0120983 A1 | 5/2014 | Lam |
| 2014/0187160 A1 | 7/2014 | Prencipe |
| 2014/0218529 A1 | 8/2014 | Mahmoud et al. |
| 2014/0238153 A1 | 8/2014 | Wood et al. |
| 2014/0240132 A1 | 8/2014 | Bychkov |
| 2014/0244009 A1 | 8/2014 | Mestas |
| 2014/0274203 A1 | 9/2014 | Ganong, III |
| 2014/0309849 A1 | 10/2014 | Ricci |
| 2014/0361934 A1 | 12/2014 | Ely et al. |
| 2014/0361945 A1 | 12/2014 | Misra et al. |
| 2015/0003693 A1 | 1/2015 | Baca et al. |
| 2015/0019266 A1 | 1/2015 | Stempora |
| 2015/0028996 A1 | 1/2015 | Agrafioti |
| 2015/0046996 A1 | 2/2015 | Slaby et al. |
| 2015/0062086 A1 | 3/2015 | Nattukallingal |
| 2015/0065090 A1 | 3/2015 | Yeh |
| 2015/0098309 A1 | 4/2015 | Adams |
| 2015/0124096 A1 | 5/2015 | Koravadi |
| 2015/0126824 A1 | 5/2015 | Leboeuf et al. |
| 2015/0158499 A1 | 6/2015 | Koravadi |
| 2015/0186092 A1 | 7/2015 | Francis et al. |
| 2015/0220109 A1 | 8/2015 | VonBadinski et al. |
| 2015/0277559 A1 | 10/2015 | Vescovi et al. |
| 2015/0338926 A1 | 11/2015 | Park et al. |
| 2015/0352953 A1 | 12/2015 | Koravadi |
| 2016/0028267 A1 | 1/2016 | Lee et al. |
| 2016/0098530 A1 | 4/2016 | Dill et al. |
| 2016/0189149 A1 | 6/2016 | MacLaurin et al. |
| 2016/0192407 A1 | 6/2016 | Fyfe et al. |
| 2016/0207454 A1 | 7/2016 | Cuddihy et al. |
| 2016/0226313 A1 | 8/2016 | Okubo |
| 2016/0236692 A1 | 8/2016 | Kleen et al. |
| 2016/0292563 A1 | 10/2016 | Park |
| 2016/0317060 A1 | 11/2016 | Connor |
| 2016/0334901 A1 | 11/2016 | Rihn |
| 2016/0336758 A1 | 11/2016 | Breedvelt-Schouten et al. |
| 2016/0336758 A1 | 11/2016 | Breedvelt-Schouten et al. |
| 2016/0350581 A1 | 12/2016 | Manuel et al. |
| 2016/0361032 A1 | 12/2016 | Carter et al. |
| 2017/0010677 A1 | 1/2017 | Roh et al. |
| 2017/0012925 A1 | 1/2017 | Tekin et al. |
| 2017/0024008 A1 | 1/2017 | Kienzle et al. |
| 2017/0026790 A1 | 1/2017 | Flitsch et al. |
| 2017/0042477 A1 | 2/2017 | Haverinen et al. |
| 2017/0053461 A1 | 2/2017 | Pal et al. |
| 2017/0057492 A1 | 3/2017 | Eddington et al. |
| 2017/0070078 A1 | 3/2017 | Hwang et al. |
| 2017/0075701 A1 | 3/2017 | Ricci et al. |
| 2017/0080952 A1 | 3/2017 | Gupta et al. |
| 2017/0090475 A1 | 3/2017 | Choi et al. |
| 2017/0109512 A1 | 4/2017 | Bower et al. |
| 2017/0129335 A1 | 5/2017 | Lu et al. |
| 2017/0131772 A1 | 5/2017 | Choi |
| 2017/0190121 A1 | 7/2017 | Aggarwal et al. |
| 2017/0192530 A1 | 7/2017 | Lee |
| 2017/0242428 A1 | 8/2017 | Pal et al. |
| 2017/0251967 A1 | 9/2017 | Premsukh |
| 2017/0336964 A1 | 11/2017 | Kim |
| 2017/0346635 A1 | 11/2017 | Gummeson et al. |
| 2017/0347895 A1 | 12/2017 | Wei et al. |
| 2017/0374074 A1 | 12/2017 | Stuntebeck |
| 2018/0025351 A1 | 1/2018 | Chen et al. |
| 2018/0025430 A1 | 1/2018 | Perl et al. |
| 2018/0032126 A1 | 2/2018 | Liu |
| 2018/0037228 A1 | 2/2018 | Biondo et al. |
| 2018/0039303 A1 | 2/2018 | Hashimoto et al. |
| 2018/0052428 A1 | 2/2018 | Abramov |
| 2018/0054513 A1 | 2/2018 | Ma |
| 2018/0068105 A1* | 3/2018 | Shapiro .................. G06F 21/602 |
| 2018/0093606 A1 | 4/2018 | Terwilliger et al. |
| 2018/0093610 A1 | 4/2018 | Sun et al. |
| 2018/0093672 A1 | 4/2018 | Terwilliger et al. |
| 2018/0115797 A1 | 4/2018 | Wexler et al. |
| 2018/0120891 A1 | 5/2018 | Eim |
| 2018/0120892 A1 | 5/2018 | Von Badinski et al. |
| 2018/0123629 A1 | 5/2018 | Wetzig |
| 2018/0167200 A1 | 6/2018 | High et al. |
| 2018/0174457 A1 | 6/2018 | Taylor |
| 2018/0178712 A1 | 6/2018 | Terwilliger et al. |
| 2018/0229674 A1 | 8/2018 | Heinrich et al. |
| 2018/0256027 A1 | 9/2018 | Lacher |
| 2018/0257668 A1 | 9/2018 | Tonshal |
| 2018/0262505 A1 | 9/2018 | Ligatti |
| 2018/0292901 A1 | 10/2018 | Priyantha et al. |
| 2018/0300467 A1 | 10/2018 | Kwong et al. |
| 2018/0322957 A1 | 11/2018 | Dill et al. |
| 2019/0004325 A1 | 1/2019 | Connor |
| 2019/0049267 A1 | 2/2019 | Huang |
| 2019/0083022 A1 | 3/2019 | Huang |
| 2019/0131812 A1 | 5/2019 | Lee et al. |
| 2019/0155104 A1 | 5/2019 | Li et al. |
| 2019/0155385 A1 | 5/2019 | Lim et al. |
| 2019/0172289 A1 | 6/2019 | O'Toole et al. |
| 2019/0191998 A1 | 6/2019 | Heikenfeld et al. |
| 2019/0213429 A1 | 7/2019 | Sicconi et al. |
| 2019/0230507 A1 | 7/2019 | Li et al. |
| 2019/0265868 A1 | 8/2019 | Penilla et al. |
| 2019/0286805 A1 | 9/2019 | Law et al. |
| 2019/0287083 A1 | 9/2019 | Wurmfeld et al. |
| 2019/0295440 A1 | 9/2019 | Hadad |
| 2019/0298173 A1 | 10/2019 | Lawrence et al. |
| 2019/0298265 A1 | 10/2019 | Keating |
| 2019/0313967 A1 | 10/2019 | Lee |
| 2019/0332140 A1 | 10/2019 | Wang et al. |
| 2019/0342329 A1 | 11/2019 | Turgeman |
| 2019/0357834 A1 | 11/2019 | Aarts et al. |
| 2020/0001895 A1 | 1/2020 | Scheggi |
| 2020/0005791 A1 | 1/2020 | Rakshit et al. |
| 2020/0062276 A1 | 2/2020 | Yuan et al. |
| 2020/0070840 A1 | 3/2020 | Gunaratne |
| 2020/0142497 A1 | 5/2020 | Zhu |

(56) References Cited

U.S. PATENT DOCUMENTS

| | | | |
|---|---|---|---|
| 2020/0159896 | A1 | 5/2020 | Shapiro et al. |
| 2020/0218238 | A1 | 7/2020 | Wang |
| 2020/0356652 | A1 | 11/2020 | Yamaguchi et al. |
| 2020/0391696 | A1 | 12/2020 | Kato et al. |
| 2021/0019731 | A1 | 1/2021 | Rule et al. |
| 2021/0029112 | A1 | 1/2021 | Palle et al. |
| 2021/0058692 | A1 | 2/2021 | Shankar |
| 2021/0197849 | A1 | 7/2021 | Tsuji |
| 2021/0382684 | A1 | 12/2021 | Hachiya et al. |
| 2022/0083149 | A1 | 3/2022 | Keller et al. |

FOREIGN PATENT DOCUMENTS

| | | | |
|---|---|---|---|
| CN | 105960196 | | 9/2016 |
| CN | 106360895 | | 2/2017 |
| CN | 206213423 | | 6/2017 |
| CN | 206333477 | | 7/2017 |
| CN | 206371611 | | 8/2017 |
| CN | 107139933 | | 9/2017 |
| CN | 107260139 | | 10/2017 |
| CN | 104157116 | A | 12/2017 |
| CN | 105006103 | B | 4/2018 |
| CN | 105841851 | | 8/2018 |
| CN | 108900691 | | 11/2018 |
| CN | 108926081 | | 12/2018 |
| DE | 10201301233399 | | 7/2013 |
| DE | 102015006677 | | 11/2016 |
| DE | 102019116618 | | 12/2020 |
| EP | 1223191 | A1 | 7/2002 |
| EP | 1384752 | A1 | 1/2004 |
| EP | 2281205 | A1 | 2/2011 |
| EP | 2581856 | | 4/2013 |
| JP | 200879676 | | 4/2008 |
| KR | 20110012229 | | 2/2011 |
| KR | 20170013067 | | 2/2017 |
| KR | 1020170087113 | | 7/2017 |
| KR | 101835991 | B1 | 4/2018 |
| WO | 2001017421 | | 3/2001 |
| WO | 2005114476 | A1 | 12/2005 |
| WO | 2005124594 | A1 | 12/2005 |
| WO | 2008008714 | A1 | 1/2008 |
| WO | 2011132009 | A2 | 4/2011 |
| WO | 2015077418 | | 5/2015 |
| WO | 2017136940 | | 8/2017 |
| WO | 2018000396 | | 1/2018 |
| WO | 2018048563 | A1 | 3/2018 |
| WO | 2018154341 | | 8/2018 |
| WO | 2018164632 | | 9/2018 |
| WO | 2018204811 | | 11/2018 |
| WO | 2019082095 | | 5/2019 |
| WO | 2019140528 | | 7/2019 |
| WO | 2019180626 | | 9/2019 |

OTHER PUBLICATIONS

"Vauxhall/Opel In-Car Wireless Charging", retrieved from <https://www.air-charge.com/aircharge-for-business/automotive/vauxhall-wireless-charging>, Oct. 2019, 4 pages. 2019.

"Wireless charging for smart ring/pointing devices" available online at <http://www.humavox.com/smt_product/wireless-charging-for-smart-ringpointing-devices/>, Oct. 2019, 3 pages. 2019.

Adafruit, p. 1-2, available at: https://adafruit.com/product/2806, published Jun. 2019 (Year: 2019) 2019.

Adafruit.com, "RFID/NFC Smart Ring—Size 12—NTAG213," accessed at https://web.archive.org/web/20190605061438/https://www.adafruit.com/product/2806, publication Jun. 5, 2019 Jun. 5, 2019.

ASU projection wearable: Live tomorrow today (world first launch @ CES 2016). (Dec. 2015). ASU Tech, YouTube. Retrieved from https://www.youtube.com/watch?v=Wdb5O-D7Y0Y 2015.

Brownell, L., "Low-cost wearables manufactured by hybrid 3D printing. Wyss Institute, Harvard," Retrieved from https://wyss.harvard.edu/news/low-cost-wearables-manufactured-by-hybrid-3d-printing/, Sep. 6, 2017, pp. 11 2017.

Cetin, C., "Design, testing and implementation of a new authentication method using multiple devices," Graduate Theses and Dissertations, University of South Florida Scholar Commons. Retrieved from http://scholarcommons.usf.edu/etd/5660, Jan. 2015, pp. 61 Jan. 2015.

Charles Q. Choi, "Low Battery? New Tech Lets You Wirelessly Share Power", available online at <https://www.livescience.com/54790-new-tech-enables-wireless-charging.html>, May 19, 2016, 9 pages May 19, 2016.

Chen, X. A., et al., "Encore: 3D printed augmentation of everyday objects with printed-over, affixed and interlocked attachments," Nov. 5, 2015, pp. 73-82 2015.

Chen, X. A., et al., "Reprise: A design tool for specifying, generating, and customizing 3D printable adaptations on everyday objects," Oct. 16, 2016, pp. 29-39 Oct. 16, 2016.

E-Senses, "Personal vitamin D, sunlight and daylight coach", available online at <https://e-senses.com/>, 2019, 5 pages 2019.

Google translation of KR20170087113A (Year: 2016) 2016.

Hipolite, W., "The 3D printed O Bluetooth Ring is one of the tiniest personal computers you will ever see," 3DPrint.com. Retrieved from https://3dprint.com/34627/o-bluetooth-ring-3d-printed/, Jan. 2015, pp. 5 Jan. 2015.

https://en.wikipedia.org/w/index.php?title=Ring_size&oldid=891328817 2019.

Hussain Almossawi, "This smart ring aims to provide better lives for people with sickle cell disease", retrieved from <https://www.core77.com/projects/82131/This-Smart-Ring-Aims-to-Provide-Better-Lives-for-People-with-Sickle-Cell-Disease>, 2021, 9 pages. 2021.

Je et al., "PokeRing: Notifications by poking around the finger", Proceedings of the 2018 CHI Conference on Human Factors in Computing Systems—CHI'18, 2018, paper 542, pp. 1-10 2018.

Katharine Schwab, "Orii, the ring that turns your finger into a phone, is here", available online at < https://www.fastcompany.com/90399237/orii-the-ring-that-turns-your-finger-into-a-phone-is-here >, 2019, 4 pages 2019.

Laput et al., "Skin buttons: cheap, small, low-powered and clickable fixed-icon laser projectors", UIST '14:Proceedings of the 27th annual ACM symposium on User interface software and technology, Oct. 2014 pp. 389-394. 2014.

Magno et al., "Self-sustainable smart ring for long-term monitoring of blood oxygenation", IEEE Access, 2019, pp. 115400-115408 2019.

Mahmud et al., Wearable technology for drug abuse detection: A survey of recent advancements, Smart Health, vol. 13, Aug. 2019, 100062 Aug. 2019.

Margaret, "The Orb: A Bluetooth headset that turns into a ring", Gadgets, BornRich, Jun. 2013, available online at <http://www.bornrich.com/the-orb-a-bluetooth-headset-that-turns-into-a-ring.html >. Jun. 2013.

Mario, https://www.smartringnews.com/posts/smart-ring-vs-smartwatch-which-is-the-best-fitness-and-activity-tracker 2014.

Nassi et al., "Virtual breathalyzer", Department of Software and Information Systems Engineering, Ben-Gurion University of the Negev, Israel, 2016, 10 pages 2016.

Neev Kiran, "SkinnySensor: Enabling Battery-Less Wearable Sensors via Intrabody Power Transfer", Masters Theses 694, University of Massachusetts Amherst, 2018, 63 pages 2018.

Nerd-Fu, "Push present", Delicious Juice Dot Com, Apr. 2015, available online at < https://blog.deliciousjuice.com/2015/04/ > Apr. 2015.

Pablo E SuArez, "NXT Ring—Your Digital-self at Hand", available online at <https://www.youtube.com/watch?v=9w7uxDHs7NY>, uploaded on Jun. 21, 2019, 2 pages Jun. 21, 2019.

Roumen et al., "NotiRing: A comparative study of notification channels for wearable interactive rings", Proceedings of the 33rd Annual ACM Conference on Human Factors in Computing Systems—CHI'15, 2015, pp. 2497-2500 2015.

Sarah Jacobsson Purewal, "Ringly review: The smart ring that could be sexier", available online at <https://www.macworld.com/article/227133/ringly-review-the-smart-ring-that-could-be-sexier.html>, 2016, 10 pages 2016.

(56) References Cited

OTHER PUBLICATIONS

Schwab, K, "This startup wants to kill passwords—and replace them with jewelry. Fast Company, " Retrieved from https://www.fastcompany.com/90254843/this-startup-wants-to-kill-passwords-and-replace-them-with-jewelry, (Oct. 2018), pp. 7 Oct. 2018.
Seung et al., "Nanopatterned Textile-Based Wearable Triboelectric Nanogenerator", ACS Nano, vol. 9, 2015, pp. 3501-3509 2015.
Shane McGlaun, "Geek builds Bluetooth Smart Ring with OLED display", available online at <https://www.slashgear.com/geek-builds-bluetooth-smart-ring-with-oled-display-02361383/>, 2015, 6 pages 2015.
Sperlazza, "We tested four sleep tracker apps and wearables: Here are the best ones", available online at <https://www.bulletproof.com/sleep/tech/best-sleep-tracker-apps/>, 2019, 18 pages 2019.
Turunen, "Smart ring for stress control and self-understanding", available online at <https://slowfinland.fi/en/smart-ring-for-stress-control-and-self-understanding/>, 2017, 9 pages 2017.
Woochit Tech (2017). New smart ring monitors UV exposure [video file]. Retrieved from https://www.youtube.com/watch?v=4YvkioTZxjU, 3 pages. 2017.
Worgan et al., "Garment level power distribution for wearables using inductive power transfer," 9th International Conference on Human System Interactions (HSI), 2016, pp. 277-283 2016.
Xiao et al., "LumiWatch: On-arm projected graphics and touch input," Proceedings of the 2018 CHI Conference on Human Factors in Computing Systems—CHI'18, 2018, pp. 1-11 2018.
Zhu et al., "Developing a driving fatigue detection system using physiological sensors," Proceedings of the 29th Australian Conference on Computer-Human Interaction—OZCHI'17, 2017, pp. 566-570 2017.
Zhu, M., et al., "Fluidic fabric muscle sheets for wearable and soft robotics," Retrieved from https://arxiv.org/pdf/1903.08253.pdf, Mar. 2019, pp. 32 Mar. 2019.
"The Oura App | Oura Ring", available online at <https://web.archive.org/web/20191019192921/https://ouraring.com/introducing-the-new-oura-app/>, 6 pages Oct. 29, 2019.
"Get the Technical Specs of Oura Ring | Oura Ring", available online at <https://web.archive.org/web/2019129014439/https://ouraring.com/tech-specs/>, 3 pages Jan. 29, 2019.
"Learn how the Oura ring works | Go inside | Oura Ring", available online at <https://web.archive.org/web/20181127193557/https://ouraring.com/how-oura-works/>, 5 pages Nov. 27, 2018.
Oura Ring Generation 1 User Manual, available online at < https://fccid.io/2AD7V-OURARING15001/User-Manual/User-Manual-2844448.pdf>, 8 pages Nov. 24, 2015.
Oura Ring Generation 2 User Manual, available online at < https://fccid.io/2AD7V-OURA1801/User-Manual/User-manual-v2-3856414.pdf>, 13 pages Mar. 27, 2018.
Oura ring. Improve sleep. Perform better. by OURA—Kickstarter, available online at <https://web.archive.org/web/20160427015852/https://www.kickstarter.com/projects/oura/oura-ring-improve-sleep-perform-better/description>, 27 pages Apr. 27, 2016.
Oura Ring review—The Gadgeteer, available online at < https://the-gadgeteer.com/2017/08/11/oura-ring-review/> 16 pages Aug. 11, 2017.
Ouraring.com JZ50-0112 user manual available with Gen 2 ring purchase, 2 pages.
Important Information Please Read JZ50-0148 user manual available with gen 2 ring purchase, 4 pages May 13, 2019.
Important Information Please Read JZ50-0149 user manual available with gen 2 ring purchase, 4 pages May 13, 2019.
Oura Ring | Sleep Tracker and Smart Ring with a Heart Rate Monitor, available online at <https://web.archive.org/web/20180709050831/https://ouraring.com/>, 12 pages Jul. 9, 2018.
Introducing the New Oura Ring Generation 3—The Pulse Blog, available online at <https://ouraring.com/blog/oura-generation2-vs-generation3/>, 3 pages Oct. 26, 2021.
Oura Ring 2 Teardown: Inside the NBA's COVID-19-Detecting Smart Ring, available at < https://www.youtube.com/watch?v=BwA1hmSVgVY> (Screenshots) Jul. 9, 2020.
Oura Ring 2 Teardown: Inside the NBA's COVID-19-Detecting Smart Ring, available at < https://www.youtube.com/watch?v=BwA1hmSVgVY> (Script) Jul. 9, 2020.
Int'l Search Report and Written Opinion for PCT/IB2008/053982 Mar. 2009.
Hill et al., (2024) The Best Smart Ring to Rule Them All Retrieved from: https://www.wired.com/gallery/best-smart-rings/ 2024.
Kaltenbach, F. (2004). Translucent Materials: Glass, Plastics, Metals 2004.
International Search Report and Written Opinion—PCT/US2007/081119, International Search Authority—European Patent Office—Nov. 4, 2009. Nov. 2009.
Zhu et al., (2011). Wearable Sensor-Based Hand Gesture and Daily Activity Recognition for Robot-Assisted Living. IEEE Transactions on Systems, Man, and Cybernetics, Part A. 41. 569-573. 10.1109/TSMCA.2010.2093883. 2011.
Stables et al., (2022). Why the Oura Ring Gen 3 was our wearable of the year. Retrieved from: https://www.wareable.com/wearable-tech/why-the-oura-ring-3-was-our-wearable-of-the-year-2022 2022.
Sun et al., (2013). Wireless Power Transfer for Medical Microsystems. 10.1007/978-1-4614-7702-0. 2013.
U.S. Appl. No. 61/768,279 2013.
Sleep Lab validation of a wellness ring detecting sleep patterns based on photoplethysmogram, actigraphy and body temperature published Feb. 9, 2016, to Kinnunen (Year: 2016) 2016.
Rhee et al., (2000). Artifact-resistant, power-efficient design of finger-ring plethysmographic sensors. I. Design and analysis. 4. 2792-2795 vol. 4. 10.1109/IEMBS.2000.901443. 2000.
Rhee et al., (2000). Artifact-resistant, power-efficient design of finger-ring plethysmographic sensors. II. Prototyping and benchmarking. 4. 2796-2799 vol. 4. 10.1109/IEMBS.2000.901444. 2000.
Dynamic drinkware-type analysis for mestas.
Liu et al., (2009). UWave: Accelerometer-based personalized gesture recognition and its applications. Pervasive and Mobile Computing. 5. 657-675. 10.1016/j.pmcj.2009.07.007. 2009.
Trigueiros et al., (2019). A comparison of machine learning algorithms applied to hand gesture recognition. 2019.
Castaneda et al., (2018), Int J Biosens Bioelectron. 2018, "A review on wearable photoplethysmography sensors and their potential future applications in health care"; 4(4):195-202. doi: 10.15406/ijbsbe.2018.04.00125. 2018.
Mendelson et al., (2006). A Wearable Reflectance Pulse Oximeter for Remote Physiological Monitoring. Conference proceedings : . . . Annual International Conference of the IEEE Engineering in Medicine and Biology Society. IEEE Engineering in Medicine and Biology Society. Conference. 1. 912-5. 10.1109/IEMBS.2006.260137. 2006.
Smiley, S., Active RFID vs. Passive RFID: What's the Difference? https://www.atlasrfidstore.com/rfid-insider/active-rfid-vs-passive-rfid/?srsltid=AfmBOoqhNhYwPPUSENIXB8LarZMm3TVQ4ugn4nTNUhfpy-9yYC_j0wdm Mar. 2016.
Lawton, G., (2022). Active vs. passive RFID tags: Which to choose: TechTarget. Retrieved from: https://www.techtarget.com/searcherp/tip/Active-vs-passive-RFID-tags-Which-to-choose Nov. 2022.
Amma et al., (2010). Airwriting recognition using wearable motion sensors. ACM International Conference Proceeding Series. 10. 10.1145/1785455.1785465. 2010.
Zhou et al., (2012). Analysis and Selection of Features for Gesture Recognition Based on a Micro Wearable Device. International Journal of Advanced Computer Science and Applications. 3. 10.14569/IJACSA.2012.030101. 2012.
Rhee et al., (2001). Artifact-resistant power-efficient design of finger-ring plethysmographic sensors. IEEE transactions on biomedical engineering. 48. 795-805. 10.1109/10.930904. 2001.
Ying et al., (2007). Automatic Step Detection in the Accelerometer Signal. 10.1007/978-3-540-70994-7_14. 2007.
100 Best Inventions of 2020 https://time.com/collection/best-inventions-2020/ 2020.
Clark, B. A.. "Color in Sunglass Lenses *. " Optometry and Vision Science 46 (1969): 825-840. 1969.

(56) References Cited

OTHER PUBLICATIONS

Rhee, Sokwoo. (2006). Design and analysis of artifact-resistive finger photoplethysmographic sensors for vital sign monitoring /. 2006.

Webster, J.G., Design of pulse oximeters Webster—Institute of Physics Publishing—2003 2003.

Park et al., (2011). E-gesture: A collaborative architecture for energy-efficient gesture recognition with hand-worn sensor and mobile devices. SenSys 2011—Proceedings of the 9th ACM Conference on Embedded Networked Sensor Systems. 359-360. 10.1145/1999995.2000034. 2011.

Teh et al., (2000). Embedding of electronics within thermoplastic polymers using injection moulding technique. Filtration Industry Analyst. 10-18. 10.1109/IEMT.2000.910703. 2000.

Sakai, Tadamoto. (1993). Encapsulation process for electronic devices using injection molding method. Advances in Polymer Technology. 12. 61-71. 10.1002/adv.1993.060120106. 1993.

Ardebili et al.—William Andrew—2019. Encapsulation technologies for electronic applications 2019.

Au et al., (2009). Episodic Sampling: Towards Energy-efficient Patient Monitoring with Wearable Sensors. Conference proceedings : . . . Annual International Conference of the IEEE Engineering in Medicine and Biology Society. IEEE Engineering in Medicine and Biology Society. Conference. 2009. 6901-5. 10.1109/IEMBS.2009.5333615. 2009.

Silverman, A. (2002). Fifty Years of Glass-Making. Industrial & Engineering Chemistry. 18. 10.1021/ie50201a004. 2002.

Petropoulos et al., (2012). Flexible PCB-MEMS flow sensor. Procedia Engineering. 47. 236-239. 10.1016/j.proeng.2012.09.127. 2012.

Schlömer et al., (2008). Gesture Recognition with a Wii Controller. First publ. in: Proceedings of the 2nd International Conference on Tangible and Embedded Interaction 2008, Bonn, Germany, Feb. 18-20, 2008, pp. 11-14. 10.1145/1347390.1347395. 2008.

Rekimoto, J. (2001). GestureWrist and GesturePad: unobtrusive wearable interactiondevices. International Symposium on Wearable Computers, Digest of Papers. 21-27. 10.1109/ISWC.2001.962092. 2001.

Guidelines to Enhancing the Heart-Rate Monitoring Performance of Biosensing Wearables https://www.analog.com/en/resources/technical-articles/guidelines-to-enhancing-the-heartrate-monitoring-performance-of-biosensing-wearables.html 2019.

Krzyanowski, J. "How are PCB's made? A Beginner's Guide to the PCB Manufacturing Process" Retrieved from Knowledge zone https://vectorbluehub.com/how-are-pcbs-made 2023.

Ciofu, C., et al., (2013) Injection and Micro Injection of Polymeric . . . First edition of the International Scientific Conference Modern Technologies in Machine Manufacturing Technology TMCM ISSN 2067-3604, vol. V, No. 1/2013 https://modtech.ro/international-journal/vol5no12013/Ciofu_Ciprian_1.pdf 2013.

Ross, R.J.. (2004). LCP injection molded packages—keys to JEDEC 1 performance. 1807-1811 vol. 2. 10.1109/ECTC.2004.1320364. 2004.

Murphy, K. (2012) Machine learning: a probabilistic perspective 2012.

Olofson et al., Machining of titanium alloys—Battelle Memorial Institute, Defense Metals Information Center—1965 1965.

Asada et al., "Mobile monitoring with wearable photoplethysmographic biosensors," in IEEE Engineering in Medicine and Biology Magazine, vol. 22, No. 3, pp. 28-40, May-Jun. 2003, doi: 10.1109/MEMB.2003.1213624 2003.

Chen et al., (2009). Monitoring Human Movements at Home Using Wearable Wireless Sensors. Engineering Faculty Presentations. 2009.

On the Heels of 1 Million Rings Sold, Oura Now Valued at $2.55 Billion https://www.businesswire.com/news/home/20220405006108/en/On-the-Heels-of-1-Million-Rings-Sold-Oura-Now-Valued-at-2.55-Billion#:~:text=SAN%20FRANCISCO%2D%2D(BUSINESS%20WIRE,of%20selling%201%2C000%2C000%20Oura%20Rings. Apr. 2022.

Lister et al., (2018) Optical properties of human skin https://www.spiedigitallibrary.org/journals/journal-of-biomedical-optics/volume17/issue-9/090901/Optical-properties-of-human-skin/10.1117/1.JBO.17.9.090901.full 2018.

Uchino et al., (2000). Prediction of Optical Properties of Commercial Soda-Lime-Silicate Glasses Containing Iron. Journal of Non-Crystalline Solids. 261. 72-78. 10.1016/S0022-3093(99)00617-1. 2000.

Lawrence et al., (1989) "Pulse Oximetry" Anesthesiology: The journal of the American Society of Anesthesiologists, Inc. vol. 70 No. 1 1989.

Konig et al., (1998) "Reflectance Pulse Oximetry-Principles and obstetric application in the zurich system" Journal of Clinical Monitoring and Computing vol. 14 No. 6PG. 3-6 1998.

\* cited by examiner

HARVESTING ENERGY FOR A SMART RING VIA PIEZOELECTRIC CHARGING

CROSS-REFERENCES TO RELATED APPLICATIONS

This application is a continuation of U.S. Non-Provisional patent application Ser. No. 18/187,745, filed on Mar. 22, 2023, which claims priority to U.S. Non-Provisional Patent application Ser. No. 16/926,270 filed on Jul. 10, 2020, which claims priority to U.S. Provisional Patent Application No. 62/877,391, filed Jul. 23, 2019, and U.S. Provisional Patent Application No. 63/004,789, filed Apr. 3, 2020, all of which are incorporated by reference herein for all purposes.

FIELD OF THE DISCLOSURE

The present disclosure generally relates to implementations of smart ring wearable devices and, more specifically, to charging smart ring devices using energy harvested from motion.

BACKGROUND

To the extent that smart ring technology has been adopted, it has a number of challenges. For example, a number of problems exist with wearable devices generally, including: they often need to be removed for charging; they often have poor fit; they often provide relatively little user interactivity; and they often provide limited functionality.

BRIEF SUMMARY

A smart ring may be configured to harvest energy from user motion using a piezoelectric effect. To that end, the smart ring may include a piezoelectric harvesting element configured to generate a voltage in response to a deformation caused by motion.

In one aspect, a smart ring includes a ring-shaped housing, a power source disposed within the ring-shaped housing, and a charging circuit. The charging circuit includes a piezoelectric harvesting element, and is configured to charge the power source by way of electrical energy generated by mechanical deformation within the piezo-electric harvesting element. The smart ring further includes a component, disposed within the ring-shaped housing and configured to draw energy from the power source, and further configured to perform at least one of: i) sense a physical phenomenon external to the ring-shaped housing, ii) send communication signals to a communication device external to the ring-shaped housing, or iii) implement a user interface.

In another aspect, a method for operating a smart ring includes generating electrical energy at a charging circuit within the smart ring by way of a mechanical deformation in a piezoelectric harvesting element of the charging circuit. The method further includes charging a power source disposed within the ring-shaped housing of the smart ring by way of the charging circuit configured to deliver the generated electrical energy to the power source. Still further, the method includes operating a component, disposed within the ring-shaped housing of the smart ring and configured to draw energy from the power source, and further configured to perform at least one of: i) sense a physical phenomenon external to the ring-shaped housing, ii) send communication signals to a communication device external to the ring-shaped housing, or iii) implement a user interface.

In another embodiment, a smart ring includes a housing configured to be worn by a user. The smart ring can further include a power source disposed within the housing. The smart ring also can include a charging circuit disposed within the housing. The charging circuit can include a harvesting element configured to charge the power source. The harvesting element can be configured to convert mechanical energy to electrical energy. The smart ring also can include a device at least partially disposed within the housing. The device can be configured to draw energy from the power source.

In another embodiment, a smart ring includes a means for housing configured to be worn by a user. The smart ring can further include a means for powering disposed within the means for housing. The smart ring also can include a means for charging disposed within the means for housing. The means for charging can include a means for harvesting configured to charge the means for powering. The means for harvesting can be configured to convert mechanical energy to electrical energy. The smart ring also can include a means for drawing energy from the means for powering. The means for drawing energy from the means for powering can be at least partially disposed within the means for housing.

In another embodiment, a method for operating a smart ring includes generating electrical energy at a charging circuit within a smart ring. The charging circuit can include a harvesting element. The harvesting element can be configured to convert mechanical energy to electrical energy. The method for operating a smart ring further can include charging a power source disposed within the smart ring by delivering the electrical energy from the charging circuit to the power source. The method for operating a smart ring also can include causing the power source to provide power to a device disposed within the smart ring.

Depending upon the embodiment, one or more benefits may be achieved. These benefits and various additional objects, features and advantages of the present disclosure can be fully appreciated with reference to the detailed description and accompanying drawings that follow.

DETAILED DESCRIPTION

Figure 1:
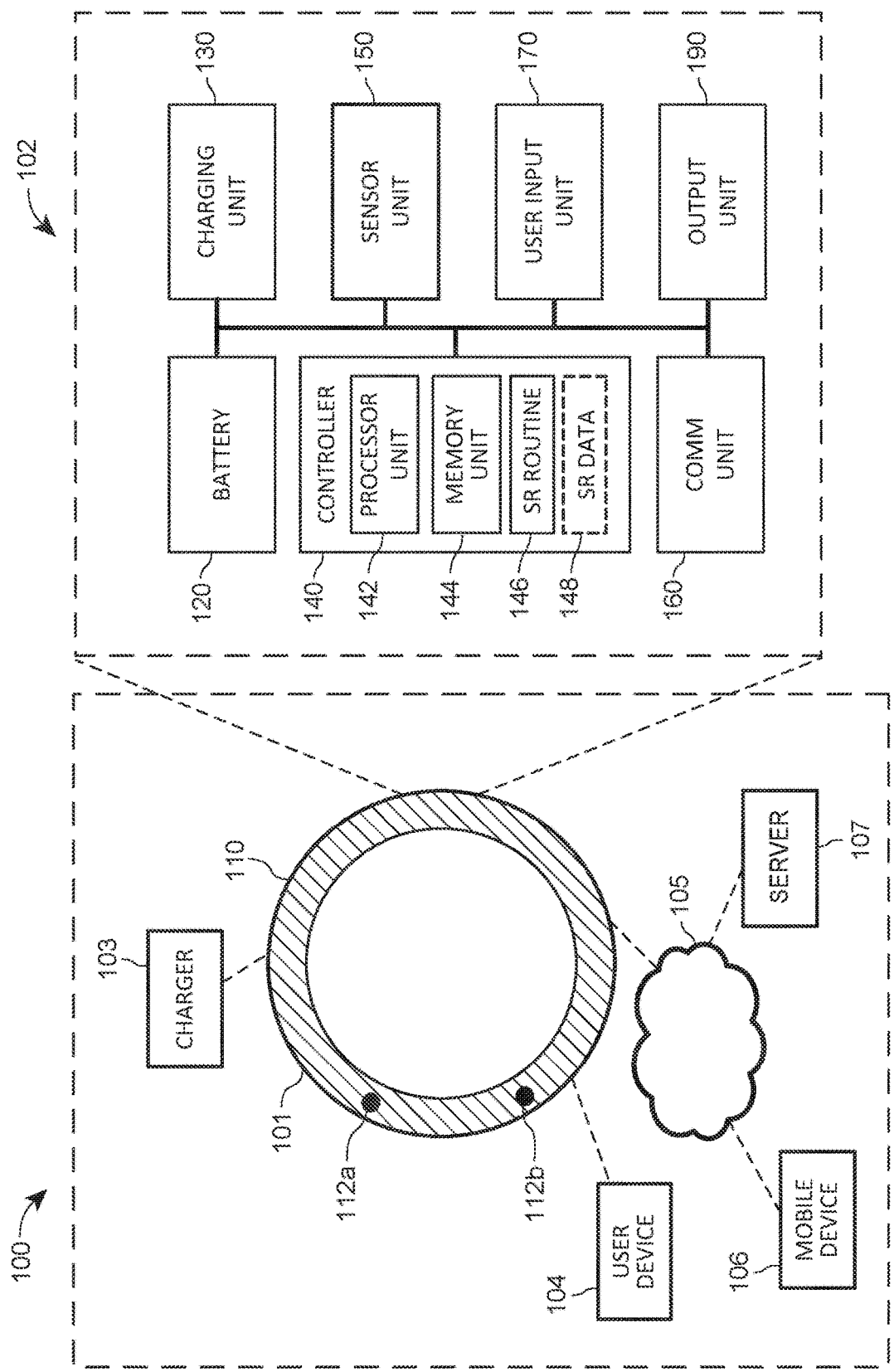
FIG. 1 illustrates a system comprising a smart ring and a block diagram of smart ring components, according to some embodiments.

Smart ring wearable technology can enable a wide range of applications including security, safety, health and wellness, and convenient interfacing between a user and a variety of technologies based at least in part upon integrating a variety of sensor, input/output devices, and computing capabilities in a compact form factor. One of the challenges in increasing smart ring capabilities is reliably powering the needed components, particularly considering the limited space for a power source in the compact form factor. An ability to conveniently charge the power source of the smart ring without removing the smart ring from a finger would contribute to the adoption of smart ring technology.

One way to charge the smart ring without removing from the finger may include using a wearable charger, or a charger disposed in the environment of the smart ring. For the purposes of charging, the charger may be connected to the smart ring by a cable. Additionally or alternatively, the smart ring may include one or more circuits that enable the smart ring to harvest optical, thermal, mechanical and/or other sources of energy to charge and/or recharge the smart ring. Some techniques for harvesting mechanical energy may be based at least in part upon electromagnetic induction, or a piezoelectric effect, as described herein. Some techniques may rely on generated variable electromagnetic fields at a charging source that may couple a portion of the generated energy to a smart ring. Such configurations may be referred to as wireless charging, rather than harvesting configurations. A charging system may generate constant magnetic fields with constant current through a properly configured conductor. Such systems rely on availability of electrical energy to sustain a magnetic field. An electromagnetic induction charging system that uses permanent magnets has the advantage of obviating the need for using electrical energy to produce magnetic fields, on the other hand.

Various techniques, systems, and methods for charging a power source of a smart ring using electromagnetic induction are discussed below with reference to FIG. 1, FIG. 2, FIG. 3, FIG. 4, FIG. 5, FIG. 6A, FIG. 6B, FIG. 7A, FIG. 7B, FIG. 8, FIG. 9A, and FIG. 9B. In section I, a smart ring and inductive charging system is described with reference to FIG. 1. In section II, example smart ring form factor types and configurations to facilitate harvesting energy via induction are discussed with reference to FIG. 2 and FIG. 3. In section III, an example operating environment in which a smart ring may operate is described with reference to FIG. 4. In section IV, an example schematic for an induction charging system is described with reference to FIG. 5. In section V, example induction charging systems are described with reference to FIG. 6A, FIG. 6B, FIG. 7A, and FIG. 7B. In section VI, a smart ring configured for charging using a piezoelectric harvesting element is described with reference to FIG. 8, FIG. 9A, and FIG. 9B. In section VII, other considerations are described.

I. Examples of Smart Ring and Smart Ring Components

FIG. 1 illustrates a system 100 comprising a smart ring 101 that may be charged via an induction charging system (e.g., by way of harvesting motion energy) according to one or more of the techniques described herein. FIG. 1 also shows one or more devices or systems that may be electrically, mechanically, or communicatively connected to the smart ring 101. As shown, the smart ring 101 may include a set of components 102, which may have various power needs and may impact the frequency with which the smart ring 101 needs recharging. To facilitate compatibility with the described energy harvesting techniques, the components 102 may be configured to be compatible with the magnetic fields and magnetic field variations to which the smart ring 101 and the components 102 may be exposed during induction charging. With respect to the described piezoelectric harvesting, the components 102 may be configured to be isolated from the potentially high voltages generated during piezoelectric harvesting.

The system 100 may comprise any one or more of: a charger 103 for the smart ring 101, a user device 104, a network 105, a mobile device 106, or a server 107. The charger 103 may provide energy to the smart ring 101 by way of a direct electrical, a wireless, or an optical connection. The smart ring 101 may be in a direct communicative connection with the user device 104, the mobile device 106, or the server 107 by way of the network 105. Interactions between the smart ring 101 and other components of the system 100 are discussed in more detail in the context of FIG. 4.

The smart ring 101 may sense a variety of signals indicative of activities of a user wearing the ring 101, biometric signals, a physiological state of the user, or signals indicative of the user's environment. The smart ring 101 may analyze the sensed signals using built-in computing capabilities or in cooperation with other computing devices (e.g., user device 104, mobile device 106, server 107) and provide feedback to the user or about the user via the smart ring 101 or other devices (e.g., user device 104, mobile device 106, server 107). Additionally or alternatively, the smart ring 101 may provide the user with notifications sent by other devices, enable secure access to locations or information, or a variety of other applications pertaining to health, wellness, productivity, or entertainment.

The smart ring 101, which may be referred to herein as the ring 101, may comprise a variety of mechanical, electrical, optical, or any other suitable subsystems, devices, components, or parts disposed within, at, throughout, or in mechanical connection to a housing 110 (which may be ring shaped and generally configured to be worn on a finger). Additionally, a set of interface components 112a and 112b may be disposed at the housing, and, in particular, through the surface of the housing. The interface components 112a and 112b may provide a physical access (e.g., electrical, fluidic, mechanical, or optical) to the components disposed within the housing. The interface components 112a and 112b may exemplify surface elements disposed at the housing. As discussed below, some of the surface elements of the housing may also be parts of the smart ring components.

As shown in FIG. 1, the components 102 of the smart ring 101 may be distributed within, throughout, or on the housing 110. As discussed in the contexts of FIG. 2 and FIG. 3 below, the housing 110 may be configured in a variety of ways and include multiple parts. The smart ring components 102 may for example, be distributed among the different parts of the housing 110, as described below, and may include surface elements of the housing 110. The housing 110 may include mechanical, electrical, optical, or any other suitable subsystems, devices, components, or parts disposed within or in mechanical connection to the housing 110, including a battery 120, a charging unit 130, a controller 140, a sensor system 150 comprising one or more sensors, a communications unit 160, a one or more user input devices 170, or a one or more output devices 190. Each of the components 120, 130, 140, 150, 160, 170, 190 may include one or more associated circuits, as well as packaging elements. The components 120, 130, 140, 150, 160, 170, 190 may be electrically or communicatively connected with each other (e.g., via one or more busses or links, power lines, etc.), and may cooperate to enable "smart" functionality described within this disclosure.

The battery 120 may supply energy or power to the controller 140, the sensors 150, the communications unit 160, the user input devices 170, or the output devices 190. In some scenarios or implementations, the battery 120 may supply energy or power to the charging unit 130. The charging unit 130, may supply energy or power to the battery 120. In some implementations, the charging unit 130 may supply (e.g., from the charger 103, or harvested from other sources) energy or power to the controller 140, the sensors 150, the communications unit 160, the user input devices 170, or the output devices 190. In a charging mode of operation of the smart ring 101, the average power supplied by the charging unit 130 to the battery 120 may exceed the average power supplied by the battery 120 to the charging unit 130, resulting in a net transfer of energy from the charging unit 130 to the battery 120. In a non-charging mode of operation, the charging unit 130 may on average, draw energy from the battery 120.

The battery 120 may include one or more cells that convert chemical, thermal, nuclear or another suitable form of energy into electrical energy to power other components or subsystems 140, 150, 160, 170, 190 of the smart ring 101. The battery 120 may include one or more alkaline, lithium, lithium-ion and or other suitable cells. The battery 120 may include two terminals that, in operation, maintain a substantially fixed voltage of 1.5, 3, 4.5, 6, 9, 12 V or any other suitable terminal voltage between them. When fully charged, the battery 120 may be capable of delivering to power-sinking components an amount of charge, referred to herein as "full charge," without recharging. The full charge of the battery may be 1, 2, 5, 10, 20, 50, 100, 200, 500, 1000, 2000, 5000 mAh or any other suitable charge that can be delivered to one or more power-consuming loads as electrical current.

The battery 120 may include a charge-storage device, such as, for example a capacitor or a super-capacitor. In some implementations discussed below, the battery 120 may be entirely composed of one or more capacitive or charge-storage elements. The charge storage device may be capable of delivering higher currents than the energy-conversion cells included in the battery 120. Furthermore, the charge storage device may maintain voltage available to the components or subsystems 130, 140, 150, 160, 170, 190 when one or more cells of the battery 120 are removed to be subsequently replaced by other cells.

The charging unit 130 may be configured to replenish the charge supplied by the battery 120 to power-sinking components or subsystems (e.g., one or more of subsystems 130, 140, 150, 160, 170, 190) or, more specifically, by their associated circuits. To replenish the battery charge, the charging unit 130 may convert one form of electrical energy into another form of electrical energy. More specifically, the charging unit 130 may convert alternating current (AC) to direct current (DC), may perform frequency conversions of current or voltage waveforms, or may convert energy stored in static electric fields or static magnetic fields into direct current. Additionally or alternatively, the charging unit 130 may harvest energy from radiating or evanescent electromagnetic fields (including optical radiation) and convert it into the charge stored in the battery 120. Furthermore, the charging unit 130 may convert non-electrical energy into electrical energy. For example, the charging unit 130 may harvest energy from motion, or from thermal gradients.

The controller 140 may include a processor unit 142 and a memory unit 144. The processor unit 142 may include one or more processors, such as a microprocessor (µP), a digital signal processor (DSP), a central processing unit (CPU), a graphical processing unit (GPU), a field-programmable gate array (FPGA), an application-specific integrated circuit (ASIC), or any other suitable electronic processing components. Additionally or alternatively, the processor unit 142 may include photonic processing components.

The memory unit 144 may include one or more computer memory devices or components, such as one or more registers, RAM, ROM, EEPROM, or on-board flash memory. The memory unit 144 may use magnetic, optical, electronic, spintronic, or any other suitable storage technology. In some implementations, at least some of the functionality the memory unit 144 may be integrated in an ASIC or and FPGA. Furthermore, the memory unit 144 may be integrated into the same chip as the processor unit 142 and the chip, in some implementations, may be an ASIC or an FPGA.

The memory unit 144 may store a smart ring (SR) routine 146 with a set of instructions, that, when executed by the processor 142 may enable the operation and the functionality described in more detail below. Furthermore, the memory unit 144 may store smart ring (SR) data 148, which may include (i) input data used by one or more of the components 102 (e.g., by the controller when implementing the SR routine 146) or (ii) output data generated by one or more of the components 102 (e.g., the controller 140, the sensor unit 150, the communication unit 160, or the user input unit 170). In some implementations, other units, components, or devices may generate data (e.g., diagnostic data) for storing in the memory unit 144.

The processing unit 142 may draw power from the battery 120 (or directly from the charging unit 130) to read from the memory unit 144 and to execute instructions contained in the smart ring routine 146. Likewise, the memory unit 144 may draw power from the battery 120 (or directly from the charging unit 130) to maintain the stored data or to enable reading or writing data into the memory unit 144. The processor unit 142, the memory unit 144, or the controller 140 as a whole may be capable of operating in one or more low-power mode. One such low power mode may maintain the machine state of the controller 140 when less than a threshold power is available from the battery 120 or during a charging operation in which one or more battery cells are exchanged.

The controller 140 may receive and process data from the sensors 150, the communications unit 160, or the user input devices 170. The controller 140 may perform computations to generate new data, signals, or information. The controller 140 may send data from the memory unit 144 or the generated data to the communication unit 160 or the output devices 190. The electrical signals or waveforms generated by the controller 140 may include digital or analog signals or waveforms. The controller 140 may include electrical or electronic circuits for detecting, transforming (e.g., linearly or non-linearly filtering, amplifying, attenuating), or converting (e.g., digital to analog, analog to digital, rectifying, changing frequency) of analog or digital electrical signals or waveforms.

The sensor unit 150 may include one or more sensors disposed within or throughout the housing 110 of the ring 101. Each of the one or more sensors may transduce one or more of: light, sound, acceleration, translational or rotational movement, strain, temperature, chemical composition, surface conductivity or other suitable signals into electrical or electronic sensors or signals. A sensor may be acoustic, photonic, micro-electro-mechanical systems (MEMS) sensors, chemical, micro-fluidic (e.g., flow sensor), or any other suitable type of sensor. The sensor unit 150 may include, for example, an inertial motion unit (IMU) for detecting orientation and movement of the ring 101.

The communication unit 160 may facilitate wired or wireless communication between the ring 101 and one or more other devices. The communication unit 160 may include, for example, a network adaptor to connect to a computer network, and, via the network, to network-connected devices. The computer network may be the Internet or another type of suitable network (e.g., a personal area network (PAN), a local area network (LAN), a metropolitan area network (MAN), a wide area network (WAN), a mobile, a wired or wireless network, a private network, a virtual private network, etc.). The communication unit 160 may use one or more wireless protocols, standards, or technologies for communication, such as Wi-Fi, near field communication (NFC), Bluetooth, or Bluetooth low energy (BLE). Additionally or alternatively, the communication unit 160 may enable free-space optical or acoustic links. In some implementations, the communication unit 160 may include one or more ports for a wired communication connections. The wired connections used by the wireless communication module 160 may include electrical or optical connections (e.g., fiber-optic, twisted-pair, coaxial cable).

User input unit 170 may collect information from a person wearing the ring 101 or another user, capable of interacting with the ring 101. In some implementations, one or more of the sensors in the sensor unit 150 may act as user input devices within the user input unit 170. User input devices may transduce tactile, acoustic, video, gesture, or any other suitable user input into digital or analog electrical signal, and send these electrical signals to the controller 140.

The output unit 190 may include one or more devices to output information to a user of the ring 101. The one or more output devices may include acoustic devices (e.g., speaker, ultrasonic); haptic (thermal, electrical) devices; electronic displays for optical output, such as an organic light emitting device (OLED) display, a laser unit, a high-power light-emitting device (LED), etc.; or any other suitable types of devices. For example, the output unit 190 may include a projector that projects an image onto a suitable surface. In some implementations, the sensor unit 150, the user input unit 170, and the output unit 190 may cooperate to create a user interface with capabilities (e.g., a keyboard) of much larger computer systems, as described in more detail below.

The components 120, 130, 140, 150, 160, 170, 190 may be interconnected by a bus 195, which may be implemented using one or more circuit board traces, wires, or other electrical, optoelectronic, or optical connections. The bus 195 may be a collection of electrical power or communicative interconnections. The communicative interconnections may be configured to carry signals that conform to any one or more of a variety of protocols, such as I2C, SPI, or other logic to enable cooperation of the various components.

II. Example Smart Ring Form Factor Types

Figure 2:
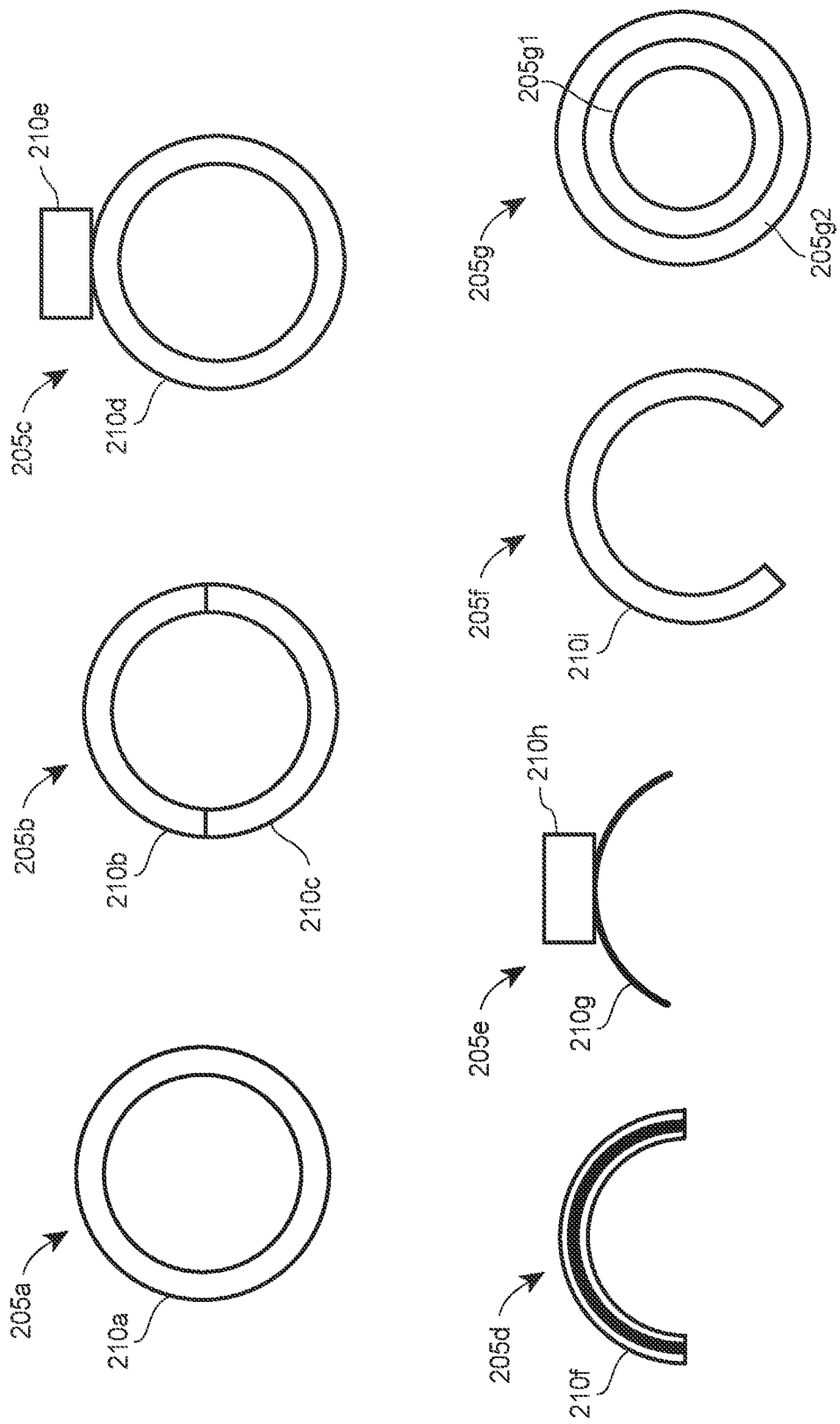
FIG. 2 illustrates a number of different form factor types of a smart ring, according to some embodiments.

FIG. 2 includes block diagrams of a number of different example form factor types or configurations 205a, 205b, 205c of a smart ring (e.g., the smart ring 101). When the smart ring uses electromagnetic induction charging using permanent magnets, a form factor and configuration of the smart ring may influence or, conversely, depend on the implementation of a charging circuit. In particular, the configuration of an induction coil may be tied to a form factor of the smart ring, as discussed below.

The configurations 205a, 205b, 205c (which may also be referred to as the smart rings 205a, 205b, 205c) may each represent an implementation of the smart ring 101, and each may include any one or more of the components 102 (or components similar to the components 102). In some embodiments, one or more of the components 102 may not be included in the configurations 205a, 205b, 205c. The configurations 205a, 205b, 205c include housings 210a, 210b, 210c, which may be similar to the housing 110 shown in FIG. 1.

The configuration 205a may be referred to as a band-only configuration comprising a housing 210a. In the configuration 205b, a band may include two or more removably connected parts, such as the housing parts 210b and 210c. The two housing parts 210b and 210c may each house at least some of the components 102, distributed between the housing parks 210b and 210c in any suitable manner.

The configuration 205c may be referred to as a band-and-platform configuration comprising (i) a housing component 210d and (ii) a housing component 210e (sometimes called the "platform 210e"), which may be in a fixed or removable mechanical connection with the housing 210d. The platform 210e may function as a mount for a "jewel" or for any other suitable attachment. The housing component 210d and the platform 210e may each house at least one or more of the components 102 (or similar components).

In some instances, the term "smart ring" may refer to a partial ring that houses one or more components (e.g., components 102) that enable the smart ring functionality described herein. The configurations 205d and 205e may be characterized as "partial" smart rings, and may be configured for attachment to a second ring. The second ring may be a conventional ring without smart functionality, or may be second smart ring, wherein some smart functionality of the first or second rings may be enhanced by the attachment.

The configuration 205d, for example, may include a housing 210f with a groove to enable clipping onto a conventional ring. The grooved clip-on housing 210f may house the smart ring components described above. The configuration 205e may clip onto a conventional ring using a substantially flat clip 210g part of the housing and contain the smart ring components in a platform 210h part of the housing.

The configuration 205f, on the other hand, may be configured to be capable of being mounted onto a finger of a user without additional support (e.g., another ring). To that end, the housing 210i of the configuration 205f may be substantially of a partial annular shape subtending between 180 and 360 degrees of a full circumference. When implemented as a partial annular shape, the housing 210i may be more adaptable to fingers of different sizes that a fully annular band (360 degrees), and may be elastic. A restorative force produced by a deformation of the housing 210i may ensure a suitable physical contact with the finger. Additional suitable combinations of configurations (not illustrated) may combine at least some of the housing features discussed above.

The configuration 205g may be configured to have two rings, a first ring 205g1 capable of and adapted to be mounted onto a finger of a user, and a second ring 205g2 capable of and adapted to be directly mounted onto the first ring 205g1, as depicted in FIG. 2. Said another way, the first ring 205g1 and the second ring 205g2 are arranged in a concentric circle arrangement, such that the second ring 205g2 does not contact a user's finger when the smart ring 205g is worn. Rather, only the first ring 205g1 contacts the user's finger. Additional suitable combinations of configurations (not illustrated) may combine at least some of the housing features discussed above.

Figure 3:
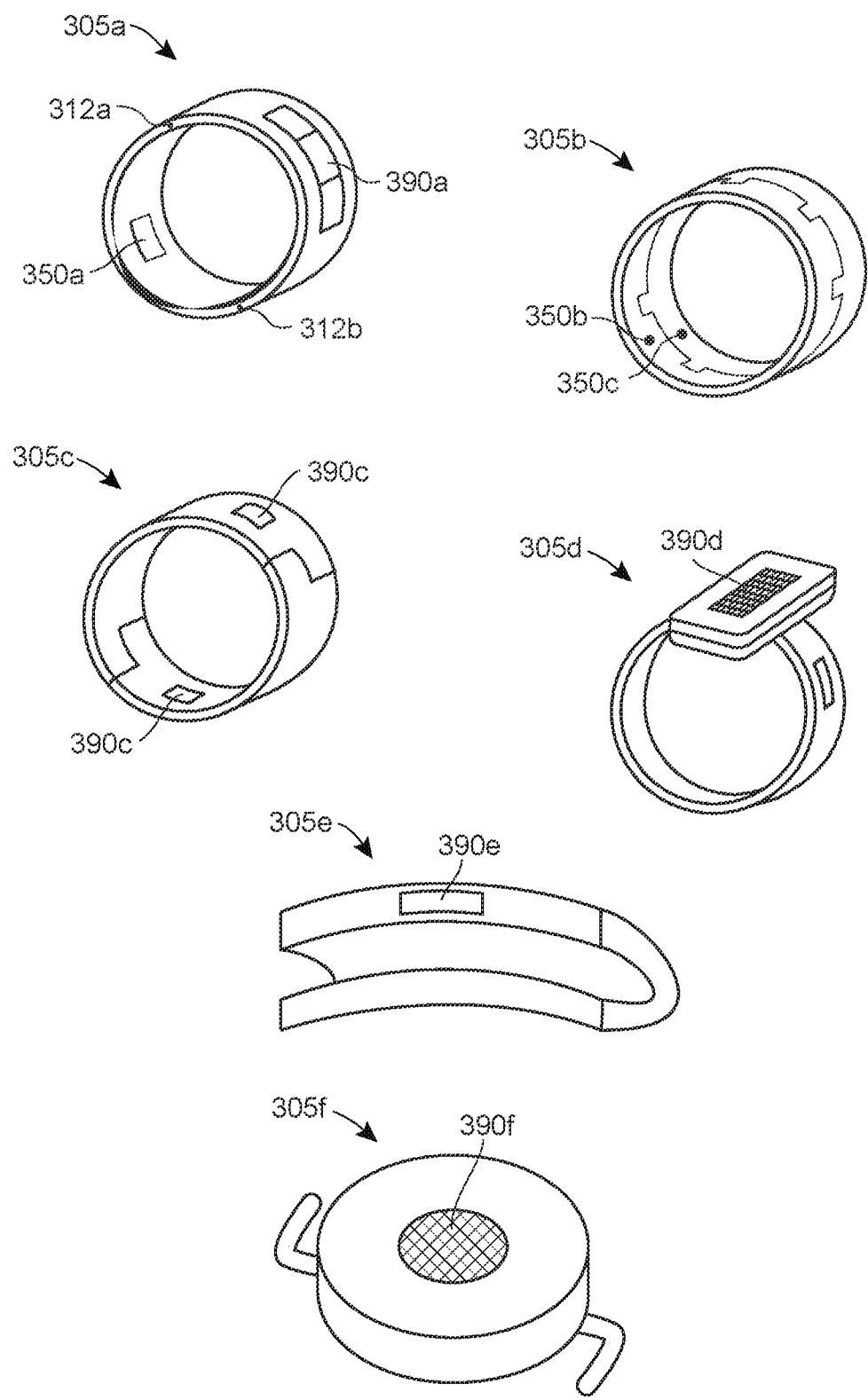
FIG. 3 illustrates examples of different smart ring form factors.

FIG. 3 includes perspective views of example configurations 305a, 305b, 305c of a smart right (e.g., the smart ring 101) in which a number of surface elements are included. When the smart ring uses electromagnetic induction charging using permanent magnets, a form factor and configuration of the smart ring may influence or, conversely, depend on the implementation of a charging circuit. In particular, the configuration of an induction coil may be tied to a form factor of the smart ring, as discussed below. Additionally, some of the surface elements may be configured to indicate when a magnetic field at the smart ring rises above or falls below a threshold.

Configuration 305a is an example band configuration 205a of a smart ring (e.g., smart ring 101). Some of the surface elements of the housing may include interfaces 312a, 312b that may be electrically connected to, for example, the charging unit 130 or the communications unit 160. On the outside of the configuration 305a, the interfaces 312a, 312b may be electrically or optically connected with a charger to transfer energy from the charger to a battery (e.g., the battery 120), or with another device to transfer data to or from the ring 305a. The outer surface of the configuration 305a may include a display 390a, while the inner surface may include a biometric sensor 350a.

The configurations 305b and 305c are examples of configurations of a smart ring with multiple housing parts (e.g., configuration 205b in FIG. 2). Two (or more) parts may be separate axially (configuration 305b), azimuthally (configuration 305c), or radially (nested rings, not shown). The parts may be connected mechanically, electrically, or optically via, for example, interfaces analogous to interfaces 312a, 312b in configuration 305a. Each part of a smart ring housing may have one or more surface elements, such as, for example, sensors 350b, 350c or output elements 390b, 390c. The latter may be LEDs (e.g., output element 390b) or haptic feedback devices (e.g., output element 390c), among other suitable sensor or output devices. Additionally or alternatively, at least some of the surface elements (e.g., microphones, touch sensors) may belong to the user input unit 170.

Configuration 305d may be an example of a band and platform configuration (e.g., configuration 205c), while configurations 305e and 305f may be examples of the partial ring configurations 205d and 205e, respectively. Output devices 390d, 390e, 390f on the corresponding configurations 305d, 305e, 305f may be LCD display, OLED displays, e-ink displays, one or more LED pixels, speakers, or any other suitable output devices that may be a part of a suite of outputs represented by an output unit (e.g., output unit 190). Other surface elements, such as an interface component 312c may be disposed within, at, or through the housing. It should be appreciated that a variety of suitable surface elements may be disposed at the illustrated configurations 305a, 305b, 305c at largely interchangeable locations. For example, the output elements 390d, 390e, 390f may be replaced with sensors (e.g., UV sensor, ambient light or noise sensors, etc.), user input devices (e.g., buttons, microphones, etc.), interfaces (e.g., including patch antennas or optoelectronic components communicatively connected to communications units), or other suitable surface elements.

III. Example Operating Environments for a Smart Ring

Figure 4:
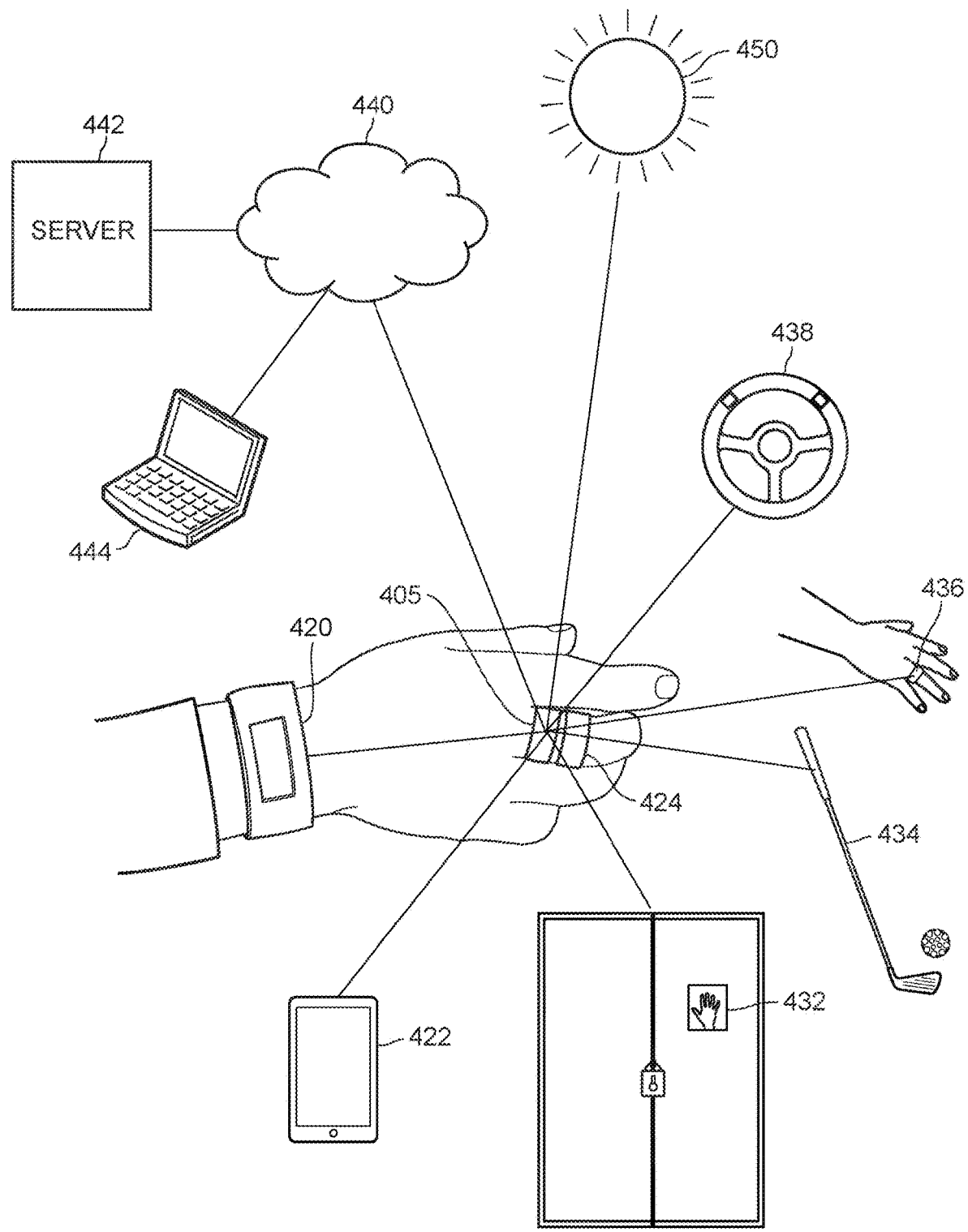
FIG. 4 illustrates an environment within which a smart ring may operate, according to some embodiments.

FIG. 4 illustrates an example environment 400 within which a smart ring 405 may be configured to operate. A portion of an electromagnetic induction charging system (e.g., one or more permanent magnets) may be disposed within the environment, as discussed below. In an embodiment, the smart ring 405 may be the smart ring 101. In some embodiments, the smart ring 405 may be any suitable smart ring capable of providing at least some of the functionality described herein. Depending on the embodiment, the smart ring 405 may be configured in a manner similar or equivalent to any of the configurations 205a, 205b, 205c or 305a, 305b, 305c shown in FIG. 2 and FIG. 3.

The smart ring 405 may interact (e.g., by sensing, sending data, receiving data, receiving energy) with a variety of devices, such as bracelet 420 or another suitable wearable device, a mobile device 422 (e.g., a smart phone, a tablet, etc.) that may be, for example, the user device 104, another ring 424 (e.g., another smart ring, a charger for the smart ring 405, etc.), a secure access panel 432, a golf club 434 (or another recreational accessory), a smart ring 436 worn by another user, or a steering wheel 438 (or another vehicle interface). Additionally or alternatively, the smart ring 405 may be communicatively connected to a network 440 (e.g., WiFi, 5G cellular), and by way of the network 440 (e.g., network 105 in FIG. 1) to a server 442 (e.g., server 107 in FIG. 1) or a personal computer 444 (e.g., mobile device 106). Additionally or alternatively, the ring 405 may be configured to sense or harvest energy from natural environment, such as the sun 450.

The ring 405 may exchange data with other devices by communicatively connecting to the other devices using, for example, the communication unit 160. The communicative connection to other device may be initiated by the ring 405 in response to user input via the user input unit 170, in response to detecting trigger conditions using the sensor unit 150, or may be initiated by the other devices. The communicative connection may be wireless, wired electrical connection, or optical. In some implementation, establishing a communicative link may include establishing a mechanical connection.

The ring 405 may connect to other devices (e.g., a device with the charger 103 built in) to charge the battery 120. The connection to other devices for charging may enable the ring 405 to be recharged without the need for removing the ring 405 from the finger. For example, the bracelet 420 may include an energy source that may transfer the energy from the energy source to the battery 120 of the ring 405 via the charging unit 430. To that end, an electrical (or optical) cable may extend from the bracelet 420 to an interface (e.g., interfaces 112a, 112b, 312a, 312b) disposed at the housing (e.g., housings 110, 210a, 210b, 210c, 210d, 210e, 210f, 210g, 210h, 210i) of the ring 405. The mobile device 422, the ring 424, the golf club 434, the steering wheel 438 may also include energy source configured as chargers (e.g., the charger 103) for the ring 405. The chargers for may transfer energy to the ring 405 via a wired or wireless (e.g., inductive coupling) connection with the charging unit 130 of the ring 405.

In some implementations, the environment 400 may include elements to facilitate harvesting of energy produced by motion of a user wearing the ring 405 (e.g., an embodiment of the ring 101). For example, one or more permanent magnets may be disposed within the environment 400 (e.g., in the golf club 434, the steering wheel 438, or any other suitable location), configuring a magnetic field that the ring 405 may use for charging the battery 120.

The ring 405 may include (e.g., as a part of the charging unit 130) a charging circuit that, in turn, includes an induction coil. When user motion changes magnetic flux from the one or more permanent magnets through the induction coil, a current may be induced in the coil. The charging circuit may be configured to charge a power source (e.g., the battery 120) disposed within the ring 405 using the current induced in the coil.

Figure 5:
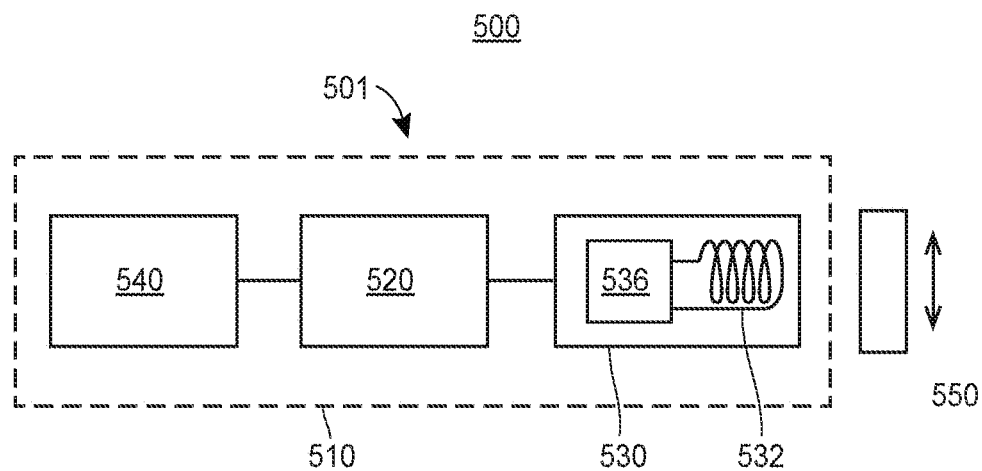
FIG. 5 is a schematic diagram of a charging system for a smart ring, according to some embodiments.

IV. Example Diagram of an Electromagnetic Induction Charging System for a Smart Ring FIG. 5 is a schematic diagram of a charging system 500 for a smart ring 501 (e.g., smart ring 101, smart ring 405) that may operate, for example, within the environment 400. The structure of the charging system 500 provides a general framework for implementations discussed in reference to FIG. 6A, FIG. 6B, FIG. 7A, FIG. 7B.

Disposed within a housing 510 of the smart ring, may be a power source 520 (e.g., battery 120), a charging circuit 530 (e.g., included in the charging unit 130) that includes an induction coil 532 and rectification components 536, and a smart-ring component 540 (referred to as component 540). The component 540 may be a part or an entirety of the controller 140, the sensor unit 150, the user input unit 170, the communications unit 160 or the output unit 190. The power source 520 may be in electrical connection with the charging circuit 530 and with the component 540. The charging circuit 530 may be configured to charge (add energy to) the power source 520, while the component 540 may be configured draw energy from the power source 520. The component 540 may be further configured to perform at least one of: i) sense a physical phenomenon external to the housing 510, ii) send communication signals to a communication device external to the housing 510, or iii) implement a user interface, as discussed above. The system 500 also includes one or more permanent magnets disposed in a magnet module 550. The magnet module 550 may be any aspect of the environment (e.g., in the golf club 434, the steering wheel 438 of the environment 400, in a keyboard of a computer, etc.) where one or more permanent magnets may be disposed to set up a magnetic field at the location of the ring. In certain examples, a magnet module 550 may be a part of the ring, as described in more detail below, in reference to FIG. 7. Changing a relative position of the coil 532 and the magnet module 550 may change magnetic flux from the one or more permanent magnets of the module 550 through the induction coil 532, generating electricity for charging the power source 520. Changing the relative position of the coil 532 and the magnet module 550 may be the result of motion of a user wearing the ring 501, for example.

The induction coil 532 may have 1, 3, 10, 30, 100, 300, 1000, 3000, 10000 or any other suitable number of turns of a conductive wire (or another suitable conductor, such as a trace). The conductive wire may have a diameter of 10 μm, 20 μm, 50 μm, 100 μm, 200 μm, 500 μm, 1 mm, 2 mm, or any other suitable diameter. The conductive wire may be at least in part made of copper, gold, or any other suitable conductive material and may include polymer coating to electrically isolate neighboring turns. The permanent magnets of the magnet module 550 may be rare earth magnets (e.g., neodymium, samarium-cobalt), alnico magnets, or ceramic magnets of suitable dimensions.

The rectifying components 536 included in the charging circuit 530 may be configured to convert the generally alternating current (AC) waveform generated in the coil 532 to a direct current (DC) output suitable for charging the power source 520. Smoothing the voltage excursions in the generated AC (e.g., by converting to DC) may increase the energy efficiency of charging. The rectifying components 536 may include discrete or integrated electronic components configured as filters, diode-bridge rectifiers, H-bridge rectifiers, buck converters, boost converters, buck-boost converters, or any other suitable circuits. In some implementations, the rectifying components 536 may include a commutator.

In a sense, the rectifying components 536 may be thought to include an rectifier configured to rectify or convert (e.g., in cooperation with a capacitor or another suitable component) AC to DC, thereby facilitating AC/DC conversion for current flowing between the coil 532 of the charging circuit and the remaining portion of the charging circuit. Depending on design considerations and various constraints, the rectifier may include a commutator or a solid-state rectifier. The commutator carries the advantage of rectifying the AC voltage across coil terminals without introducing a significant voltage drop and associated energy loss. The solid-state rectifier has fewer mechanical components than a commutator and may simplify the ring design, but may introduce a more significant voltage drop and energy loss than the commutator when rectifying.

V. Examples of the Induction Charging System for a Smart Ring

Figure 6A:
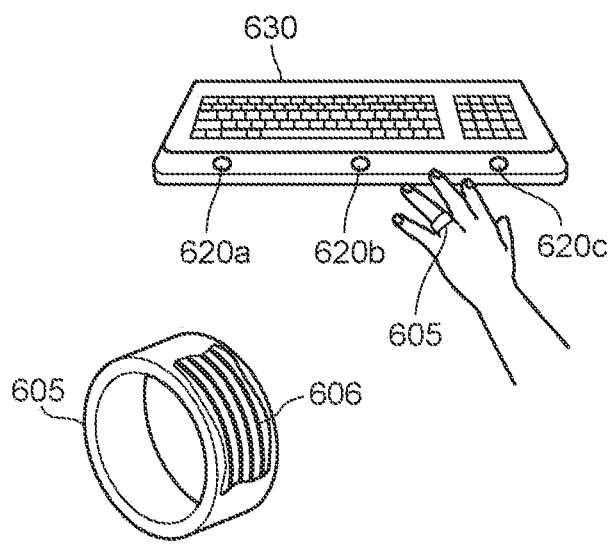
FIG. 6A illustrates an example charging system that includes one or more permanent magnets disposed near or attached to a keyboard.
Figure 6B:
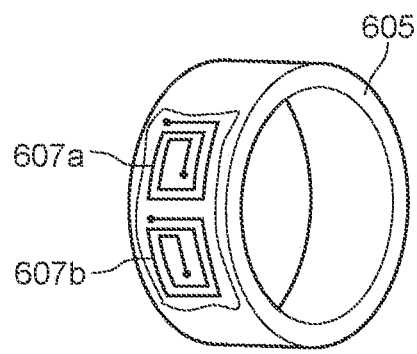
FIG. 6B illustrates a configuration of an induction coil for a charging system illustrated in FIG. 6A, according to some embodiments.

FIG. 6A illustrates an example charging system 600 (an embodiment of the charging system 500) for a smart ring 605 (e.g., that may be ring 101, ring 405, or ring 501) that includes an induction coil 606. Advantageously, the charging system 600 may harvest the energy from the motion of the ring worn by a user while typing. The charging system 600 includes permanent magnets 620a, 620b, 620c, disposed in a wrist rest 625 which is disposed near or attached to a keyboard 630.

The induction coil 606 may have 1, 2, 5, 10, 20, 50, 100, 200, 500, 1000 or any other suitable number of turns of a conductive wire. The conductive wire may have a diameter of 10 μm, 20 μm, 50 μm, 100 μm, 200 μm, 500 μm, 1 mm, 2 mm, or any other suitable diameter. The conductive wire may be at least in part made of copper, gold, or any other suitable conductive material and may include polymer coating to electrically isolate neighboring turns.

The permanent magnets 620a, 620b, 620c may be rare earth magnets (e.g., neodymium, samarium-cobalt), alnico magnets, ceramic magnets. Though FIG. 6A illustrates three magnets 620a, 620b, 620c, the charging system 600 may use 1, 2, 5, 10, 20 or any other suitable number of magnets. The magnets 620a, 620b, 620c may have any suitable shapes, including, for example, cylinder, bar, block, or horseshoe. The magnets 620a, 620b, 620c may have any suitable dimensions. For example, the magnets 620a, 620b, 620c may be cylinders and have diameters of 2, 5, 10, 20 mm and heights of 2, 5, 10, 20 mm. The magnets 620a, 620b, 620c may be oriented in any suitable direction so as to have the magnetic flux density (magnetic field) gradients substantially maximized in a vertical (z-direction), a lateral (x-direction), or any other suitable direction. Generally, the magnets 620a, 620b, 620c may be disposed so as to substantially maximize magnetic flux variations through the coil 606 during expected movement patterns of the ring 605 worn by a user. At a working distance (e.g., 5 mm to 10 cm) from the magnets 620a, 620b, 620c, the magnetic field may vary from 20, 50, 100, 200, 500, 1000, 2000, 5000 gauss (or another suitable strength) close to the magnets to less than one gauss away from the magnets 620a, 620b, 620c.

The induction coil 606 may have the turns wound substantially along the circumference of the ring 605, as illustrated in FIG. 6A, with the axis of the coil 606 aligning axially with respect to the ring 605. An axis of the coil here may be defined as the direction substantially orthogonal to a conductive path (e.g., wire or trace) of the coil. In another implementation, illustrated in FIG. 6B, one or more coils 607a, 607b may be disposed along the ring 605 with the axes oriented substantially radially with respect to the ring 605. Furthermore, the coils 607a, 607b may be implemented as wires or as conductive material (e.g., gold, copper, etc.) traces (e.g., rectangular spiral traces) of any suitable width (20, 50, 100, 200, 500 μm, etc.) on a substrate. In some implementations, the substrate may be flexible.

In general, coils 606 and 607a, 607b may electrically connect to a number of devices or components (e.g., rectifying components 536) to form a charging circuit (e.g., the charging circuit 530). The charging circuit may include one or more rectifiers (e.g., implemented with diodes) and filters (e.g., implemented with capacitors), as well as voltage regulators or DC/DC voltage converters. In implementations with multiple coils (e.g., coils 607a, 607b), each coil may be connected to a corresponding rectifier. The multiple coils may be connected in series or in parallel, depending on an implementation of the charging circuit.

Returning to FIG. 6A, user movement (e.g., typing on the keyboard) may change magnetic flux through the coil 606 by varying magnetic field strength in the vicinity of the ring 605, or varying the orientation of the coil 606 with respect to the direction of the magnetic field. The charging circuit may then charge the power source (e.g., the power source 520) using the electricity generated in the coil. In implementations with multiple coils (e.g., coils 607a, 607b), charging circuit may be configured to combine the electricity generated in each coil for charging the power source.

Figure 7A:
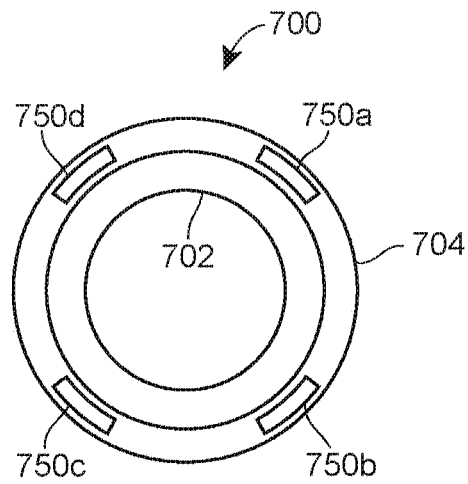
FIG. 7A illustrates an example charging system integrated into a smart ring that includes one or more permanent magnets disposed within a band of the smart ring.
Figure 7B:
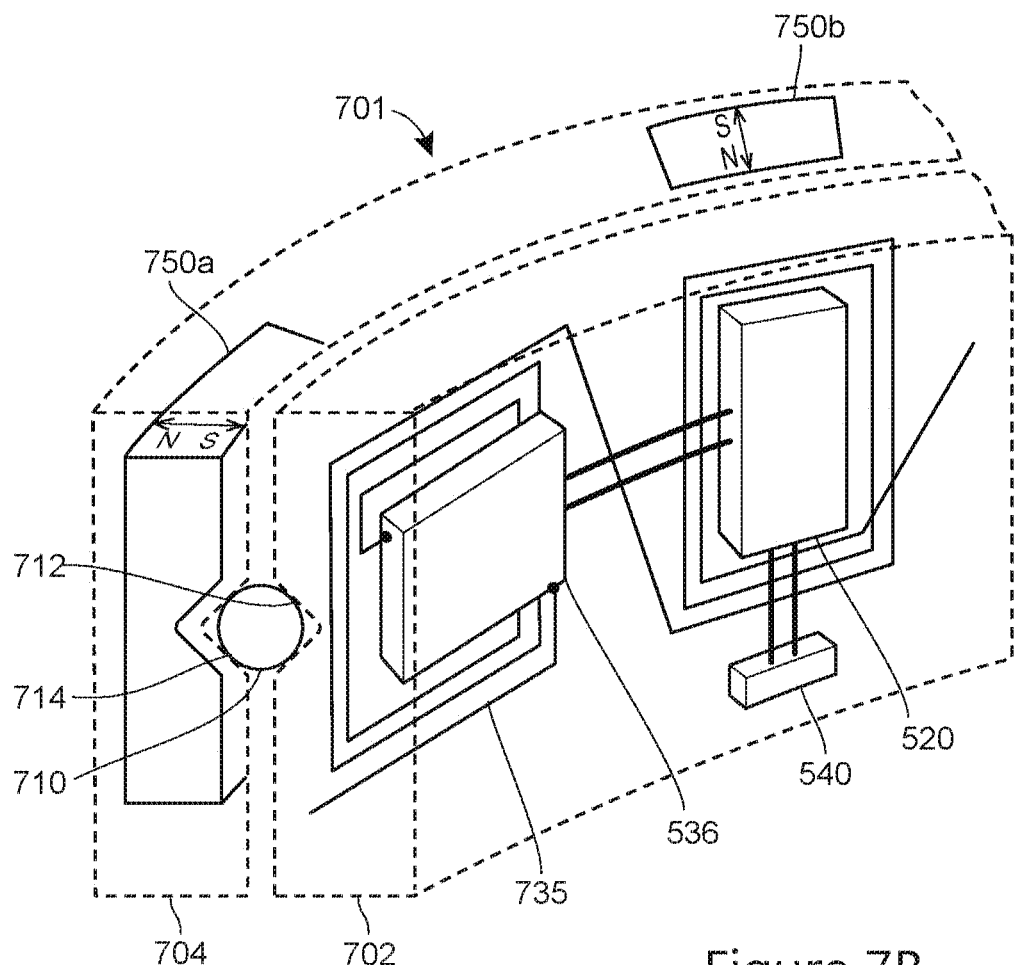
FIG. 7B illustrates a section of the smart ring in FIG. 7A, according to some embodiments.

FIG. 7A illustrates an example implementation of the charging system 500 fully integrated into a self-charging smart ring 700. The self-charging smart ring 700 may allow a user to charge the smart ring 700 by spinning a band, for example. The user may thereby fidget with the smart ring 700 recreationally while simultaneously charging the ring 700. FIG. 7B illustrates a section 701 of the smart ring 700 and, in more detail (and with a different perspective), components disposed within and a mechanical configuration of the smart ring 700. The ring 700 includes a first band 702 and a second band 704 configured to rotate substantially coaxially with respect to the first band 702. The second band 704 may include magnets 750a, 750b, 750c, 750d. In a sense, the second band 704 may be configured as the magnet module 550. The first band 702, on the other hand, may be configured as the housing 510. Thus, in a sense, the smart ring 700 may be thought of as an implementation of the charging system 500 of FIG. 5, where the magnet module 550 is movably attached to the ring housing 510. The power source 520, a coil 735 (e.g., coil 532), rectifying components 536, the component 540 may be disposed in the first band 702.

In some implementations, the magnets 750a, 750b, 750c, 750d may be distributed around the second band 704 at regular radial intervals with alternating dipole orientations in a substantially radial direction. That is, half of the magnets 750a, 750b, 750c, 750d (or any even number of magnets) may be oriented with the north pole facing the radially inner surface of the second band 704 and the other half of the magnets 750a, 750b, 750c, 750d may be oriented with the north pole facing the radially outer surface of the second band 704. Alternating magnet orientation around the circumference of the second band 704 may enhance the changes in magnetic flux through the coil 735 when the bands 702, 704 rotate with respect to each other.

In some implementations, the first band 702 and the second band 704 may be radially disposed with respect to each other. An inner radius of at least a portion of the first band 702 may be larger than an outer radius of at least a portion of the second band 704, with the first band 702 and the second band 704 forming, respectively, an outer portion of the ring 700 and an inner portion of the ring 700. In certain examples, the first band 702 and the second band 704, may form, respectively, the inner and the outer portions of the ring 700. Still in other implementations, the first band 702 and the second band 704 may be substantially axially disposed with respect to each.

In some implementations, the ring 700 may be configured as a radial ball bearing. To that end, the first band 702 and the second band 704 are configured as races for the radial ball bearing, in mechanical contact with each other by way of a suitable number of balls (e.g., ball 710). The balls may be made of plastic, glass, ceramic, metal or metal alloy (e.g., steel) or any other suitable material. The bands 702, 704 may include grooves 712, 714 for confining the balls. The ring 700 may include a cage, a shield or other suitable radial ball bearing components. In some implementations, the ring 700 may be configured as a radial roller bearing, with the bands 702, 702 configured as races for rollers.

In operation, a user may apply a force to rotate the second band 704 with respect to the first band 702 (or, conversely, the first band 702 with respect to the second 704), actuating a spin of the second band 704. The ring 700 may be configured to reduce frictional losses (e.g., using bearings as discussed above), so as to remain spinning for a certain duration (e.g., several seconds or tens of seconds) between manual actuations by the user. As the second band 704 spins with respect to the first band 702, magnetic flux through the coil 735 changes due to the motion of the magnets 750a, 750b, 750c, 750d with respect to the coil 735, inducing an AC voltage across coil terminals. The rectifying components 536 may then convert the electricity into DC form suitable for charging the power source 520.

In some implementations, the rectifying components 536 may include a commutator. The commutator, for example, may mechanically reverse polarity of a connection between the coil 735 and the remaining portion of the charging circuit. The commutator may rectify the AC voltage across coil terminals without introducing a significant voltage drop and associated energy loss, as discussed above.

In other implementations, solid state rectification components may be used instead of the commutator to reduce the number of mechanical component and simplify the ring design, but may introduce a voltage drop and associated energy loss.

The second band 704 may be removably attached to the first band 702. That is, removably attaching the second band 704 to the first band 702 may be done for the purpose of charging the smart ring 700. Removably attaching here means that the user may attach or detach the second band 704 from the first band 702. The detached second band may be removed from the finger. Removably attaching the second band 704 may preserve the rotational freedom of the second band 704 with respect to the first band. To that end, the second band 704 may include bearing balls, for example. The first band 702 may be worn on the finger of the user without the second band 704 to enable some or all of the functionality (e.g., other than charging) of the smart ring 700. In some implementations the removable second band 704 may be configured as a radially outer ring, as described above. In other implementations, the removable second band may be disposed axially (e.g., along the finger of the user wearing the smart ring 700) proximal to the first band 702 in a side-by-side configuration. In the side-by-side configuration, magnets 750a, 750b, 750c, 750d disposed in the second band may be configured to have magnetic dipoles aligned in the substantially axial direction. Correspondingly, the coil 735 in the first band 702 may be aligned to maximize magnetic flux and magnetic flux changes induced by the magnets 750a, 750b, 750c, 750d. In any case, the removable second band 704 may allow reducing the bulk of the smart ring during the segments of operation when charging is not needed.

VI. Examples of Piezoelectric Charging of a Smart Ring

Another technique for harvesting motion energy and converting it into electrical energy for use by a power source of a smart ring may include the use of a piezoelectric effect. The piezoelectric effect refers to the property of certain materials to generate voltage in response to mechanical stress that may produce microscopic deformations within the material. One advantage of using the piezoelectric effect is a relative ease of generating a substantial voltage (e.g., 1, 2, 5, 10, 20, 50, 100V or another suitable voltage), which may facilitate rectification.

Figure 8:
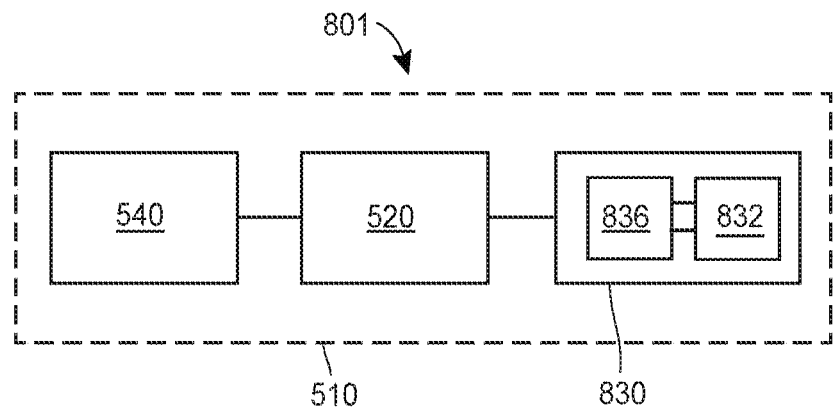
FIG. 8 is a schematic diagram of a smart ring configured to recharge by way of a piezoelectric harvesting element according to some embodiments.

Example implementations of a smart ring configured for piezoelectric harvesting of mechanical energy for charging are discussed below with reference to FIG. 8, FIG. 9A, and FIG. 9B. FIG. 8 is a schematic diagram of a smart ring 801, analogous to the smart ring 501 described in reference to FIG. 5. The smart ring 801 may represent any one or more of the smart rings 205, 305, 405, 605, 700, or 900. The configuration of the ring 801 may have the housing 510, the power source 520, and the component 540 that is configured to draw energy from the power source 520, as described above. A charging circuit 830 may replace the charging circuit 530 in FIG. 5. The charging circuit 830 may be configured to charge the power source 520 by way of electrical energy generated by a piezoelectric harvesting element 832, as discussed above. Referring to the FIG. 5, the piezoelectric harvesting element 832 may take the place of the induction coil 532. The charging circuit 830 may like the charging circuit 530, include rectification components 836.

The rectification components 836, analogously to the rectification components 536 in FIG. 5, may be configured to facilitate transforming the electrical energy generated by the piezoelectric harvesting element 832 into a form of electrical energy suitable for charging the power source 520. Though the rectification components 836 may include similar elements to the rectification components 536, e.g., diodes (e.g., in a bridge configuration), capacitors, etc., the rectification components 836 may be configured differently. More specifically, the rectification components 836 may be configured for the electrical characteristics of the piezoelectric harvesting element 832, that may have high output voltage and high output impedance. For example, the rectification components 836 may include a buck converter for stepping down the voltage output of the piezoelectric harvesting element and improving power transfer efficiency.

The piezoelectric harvesting element 832 may be disposed within the housing 510 of the smart ring 801 and configured for converting a mechanical energy input into electrical energy. The piezoelectric harvesting element 832 may be the only harvesting element in such a smart ring, or may be one of multiple harvesting elements. For example, the smart ring 801 may include the charging circuit 530 and the charging circuit 830 (which includes the piezoelectric harvesting element 832) in an embodiment.

The piezoelectric harvesting element 832 may include a deformable structure (e.g., a cantilever, a membrane, or another suitable structure) made at least in part from a piezoelectric material, the structure configured to deform under an application of an external force. The macroscopic deformation of the structure in response to the applied force may result in microscopic deformations within the piezoelectric material of the structure, and, subsequently, in voltage generation. A cumulative effect of multiple mechanical deformations, weather cyclical or aperiodic, of the piezoelectric material or structure may generate a voltage waveform that may be converted (e.g., by rectification) to drive charge accumulation in the power source 520.

After each mechanical deformation, the structure may substantially return to its original geometry, when the external force is no longer present, under the influence of the restorative force of the structure under deformation. In other implementations, the piezoelectric harvesting element may include an additional element (e.g., a spring) for providing a bias restorative force acting in opposition to the external force.

A variety of piezoelectric materials may be adapted for use within the piezoelectric harvesting element 832. The materials may be crystalline or amorphous and may include ceramics (e.g., lead zirconate titanate known as PZT, sodium potassium niobate, etc.), semiconductors (e.g., gallium nitride, zinc oxide, etc), and polymers (e.g., polyvyniladine chloride, polyvinyladine fluoride, etc.). The materials may be grown, deposited, or otherwise fabricated into thin or thick films or any other suitable form. The deformable structure (e.g., membrane, cantilever, etc.) of the piezoelectric harvesting element may include one or more piezoelectric materials.

The deformable structure of the piezoelectric harvesting may be implemented as a microelectromechanical system (MEMS), using associated fabrication techniques. In other implementations, the deformable structure may be assembled from discrete mechanical components. Still in other implementations, the deformable structure may be implemented using additive manufacturing techniques, such as 3D printing. In certain examples, the deformable structure may be fabricated using a combination of suitable techniques.

In some implementations, the deformable structure of the piezoelectric harvesting element 832 may be configured to vibrate or oscillate in response to a force impulse. A natural, e.g., resonant, frequency of oscillation of the structure may depend, for example on the geometry and the distribution of mass of the deformable structure. The oscillation of the deformable structure may induce a voltage oscillation at the corresponding frequency. The oscillation of the deformable structure may facilitate harvesting energy from periodic external forces, e.g., vibrations, particularly those with frequencies close to the natural or resonant frequency of the deformable structure. It may be advantageous to configure one or more deformable structures of the piezoelectric harvesting element 832 to have resonant frequencies close to expected frequencies of external forces or vibrations. The piezoelectric harvesting element 832 may be configured to have a resonant frequency in the range of vibration frequencies of a steering wheel or motorcycle handlebars, for example, to facilitate charging the smart ring 801 via piezoelectric energy harvesting while driving. Generally, configuring the deformable structure to have a resonant response to a vibration source may facilitate charging when the ring 801 is mechanically coupled to the vibration source. A configuration may include the frequency of the source within a 3 dB bandwidth of the resonant response of the deformable structure.

The piezoelectric harvesting element of the smart ring 801 may be configured to harvest energy from incidental movements of a user wearing the smart ring 801. For example, the piezoelectric harvesting element may be configured to harvest energy from arm swings or finger tapping. To that end, a movable mass may be disposed within the housing 510 of the smart ring 801. The movable mass may be mechanically coupled to the deformable structure of the piezoelectric harvesting element and exert a force on the deformable structure during acceleration associated with user movement and due to the inertia of the movable mass.

It may be noted that the deformable structure of the piezoelectric harvesting element may be configured with a degree of freedom in its movement aligned with any suitable direction with respect to the smart ring 801. For example, the movement direction of the deformable element may be substantially radial with respect to the ring-shaped housing 510. In certain examples, the degree of movement may be in a tangential direction, moving along the circumference of the smart ring 801. In certain examples, the degree of movement may be aligned with the axial direction, or substantially along the finger of the user. Furthermore, the directions of movement may be combined, a deformable element may be configured for two- or three-axis deformations, or multiple structures may be configured with different degrees of freedom, to take advantage of a variety of movements.

In some implementations, the piezoelectric harvesting element may be configured to harvest energy from user movements that apply a force directly to the smart ring housing 510, at least in part to charge the smart ring 801. For example, the smart ring housing 510 may include a movable component that can translate a force, applied by the user, to the piezoelectric harvesting element. One suitable configuration may be analogous to the configuration of the smart ring discussed with reference to FIG. 7A and FIG. 7B. That is, in an example configuration, the smart ring 801 may include two bands configured to move with respect to each other to thereby generate mechanical energy for harvesting via the piezoelectric effect.

Figure 9A:
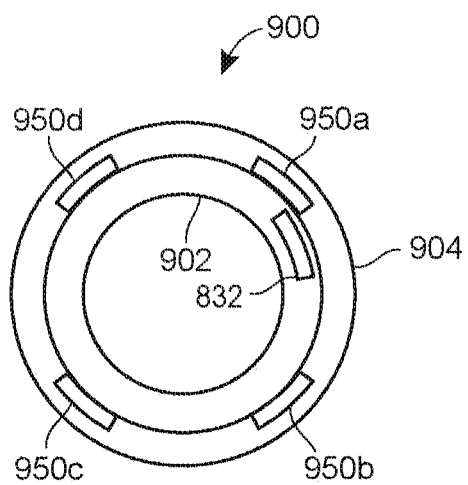
FIG. 9A illustrates a smart ring configuration with two bands configured to move with respect to one another to generate mechanical energy for piezoelectric harvesting, according to some embodiments.
Figure 9B:
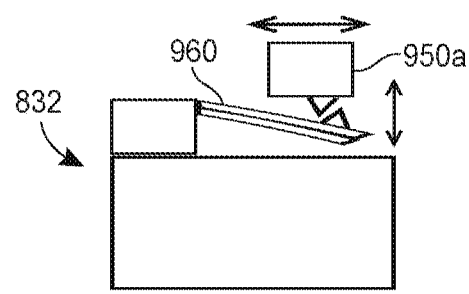
FIG. 9B illustrates a mechanism for causing deformation in a piezoelectric harvesting element when the bands in FIG. 9A move with respect to one another, according to some embodiments.

FIG. 9A and FIG. 9B illustrate a smart ring 900 that includes two bands 902, 904 configured to rotate with respect to one another for the purpose of generating mechanical energy for piezoelectric harvesting. The smart ring 900 is analogous to the smart ring 700 in FIG. 7, in a sense that both allow a user to charge the smart rings 700, 900 by rotating one of the movable bands 702, 704, 902, 904. The ring 900 may include a first band 902, in which the piezoelectric harvesting element 832 may be disposed, and a second band 904. The first band 902 and the second band 904 may be configured, respectively, as an inner ring and an outer ring, where the outer ring is disposed substantially outside the inner ring in a radial direction relative to the inner ring. The smart ring 900 may be configured as a radial ball bearing, as discussed above for the smart ring 700.

The second band 904 may include one or more actuation members 950*a-d*, disposed so as to cause a mechanical deformation within the piezoelectric harvesting element 832 that, in turn, generates electrical energy for harvesting. As the first and second bands 902, 904 move with respect to one another, the repeated mechanical deformation contributes to charging the power source 520.

FIG. 9B illustrates how the actuation member 950*a* causes the deformation in the piezoelectric harvesting element 832. The piezoelectric harvesting element 832 may include a cantilever 960 that may have a protrusion or a catch that comes into contact with a corresponding protrusion on the actuation member 950*a*, as the actuation member 950*a* moves by the harvesting element 832, the cantilever 960 deforms under the force applied by the actuation member 950*a*.

The piezoelectric harvesting element may include one or more cantilevers (e.g., cantilever 960) disposed along the circumference of the first band 902. In some implementations, the one or more cantilevers may be oriented substantially in a tangential orientation with respect to the band 902. In other implementations, the one or more cantilevers may be oriented radially with respect to the band 902.

Though the illustrated mechanism relies on mechanical contact between the actuation member 950*a* and the cantilever 960, the piezoelectric harvesting element 832 may rely on other modes of actuation (e.g., magnetic, electrostatic). For example, the actuation member 950*a* may be a magnet, and the cantilever 960 may include paramagnetic or ferromagnetic material that is repelled or attracted by a passing magnet. Thus, as the user rotates the second band 904, the magnets may cause intermittent deformations in the cantilevers (e.g., cantilever 960) or other deformable structures of the piezoelectric harvesting element 832, causing the generation of electrical energy for charging the power source 520.

It should be noted, that, though electromagnetic induction and piezoelectric effect are described in detail herein, other energy harvesting technologies may be integrated into a smart ring. Additional or alternative harvesting modules may include triboelectric, thermoelectric, or photovoltaic charging, for example.

VII. Examples of Other Considerations

When implemented in software, any of the applications, services, and engines described herein may be stored in any tangible, non-transitory computer readable memory such as on a magnetic disk, a laser disk, solid state memory device, molecular memory storage device, or other storage medium, in a RAM or ROM of a computer or processor, etc. Although the example systems disclosed herein are disclosed as including, among other components, software or firmware executed on hardware, it should be noted that such systems are merely illustrative and should not be considered as limiting. For example, it is contemplated that any or all of these hardware, software, and firmware components could be embodied exclusively in hardware, exclusively in software, or in any combination of hardware and software.

Accordingly, while the example systems described herein are described as being implemented in software executed on a processor of one or more computer devices, persons of ordinary skill in the art will readily appreciate that the examples provided are not the only way to implement such systems.

The described functions may be implemented, in whole or in part, by the devices, circuits, or routines of the system 100 shown in FIG. 1. Each of the described methods may be embodied by a set of circuits that are permanently or semi-permanently configured (e.g., an ASIC or FPGA) to perform logical functions of the respective method or that are at least temporarily configured (e.g., one or more processors and a set instructions or routines, representing the logical functions, saved to a memory) to perform the logical functions of the respective method.

Throughout this specification, some of the following terms and phrases are used.

Communication Interface according to some embodiments: Some of the described devices or systems include a "communication interface" (sometimes referred to as a "network interface"). A communication interface enables the system to send information to other systems and to receive information from other systems, and may include circuitry for wired or wireless communication.

Each described communication interface or communications unit (e.g., communications unit 160) may enable the device of which it is a part to connect to components or to other computing systems or servers via any suitable network, such as a personal area network (PAN), a local area network (LAN), or a wide area network (WAN). In particular, the communication unit 160 may include circuitry for wirelessly connecting the smart ring 101 to the user device 104 or the network 105 in accordance with protocols and standards for NFC (operating in the 13.56 MHz band), RFID (operating in frequency bands of 125-134 kHz, 13.56 MHz, or 856 MHz to 960 MHz), Bluetooth (operating in a band of 2.4 to 2.485 GHz), Wi-Fi Direct (operating in a band of 2.4 GHz or 5 GHz), or any other suitable communications protocol or standard that enables wireless communication.

Communication Link according to some embodiments: A "communication link" or "link" is a pathway or medium connecting two or more nodes. A link between two end-nodes may include one or more sublinks coupled together via one or more intermediary nodes. A link may be a physical link or a logical link. A physical link is the interface or medium(s) over which information is transferred, and may be wired or wireless in nature. Examples of physicals links may include a cable with a conductor for transmission of electrical energy, a fiber optic connection for transmission of light, or a wireless electromagnetic signal that carries information via changes made to one or more properties of an electromagnetic wave(s).

A logical link between two or more nodes represents an abstraction of the underlying physical links or intermediary nodes connecting the two or more nodes. For example, two or more nodes may be logically coupled via a logical link. The logical link may be established via any combination of physical links and intermediary nodes (e.g., routers, switches, or other networking equipment).

A link is sometimes referred to as a "communication channel." In a wireless communication system, the term "communication channel" (or just "channel") generally refers to a particular frequency or frequency band. A carrier signal (or carrier wave) may be transmitted at the particular frequency or within the particular frequency band of the channel. In some instances, multiple signals may be transmitted over a single band/channel. For example, signals may sometimes be simultaneously transmitted over a single band/channel via different sub-bands or sub-channels. As another example, signals may sometimes be transmitted via the same band by allocating time slots over which respective transmitters and receivers use the band in question.

Memory and Computer-Readable Media according to some embodiments: Generally speaking, as used herein the phrase "memory" or "memory device" refers to a system or device (e.g., the memory unit 144) including computer-readable media ("CRM"). "CRM" refers to a medium or media accessible by the relevant computing system for placing, keeping, or retrieving information (e.g., data, computer-readable instructions, program modules, applications, routines, etc.). Note, "CRM" refers to media that is non-transitory in nature, and does not refer to disembodied transitory signals, such as radio waves.

The CRM may be implemented in any technology, device, or group of devices included in the relevant computing system or in communication with the relevant computing system. The CRM may include volatile or nonvolatile media, and removable or non-removable media. The CRM may include, but is not limited to, RAM, ROM, EEPROM, flash memory, or other memory technology, CD-ROM, digital versatile disks (DVD) or other optical disk storage, magnetic cassettes, magnetic tape, magnetic disk storage or other magnetic storage devices, or any other medium which can be used to store information, and which can be accessed by the computing system. The CRM may be communicatively coupled to a system bus, enabling communication between the CRM and other systems or components coupled to the system bus. In some implementations the CRM may be coupled to the system bus via a memory interface (e.g., a memory controller). A memory interface is circuitry that manages the flow of data between the CRM and the system bus.

Network according to some embodiments: As used herein and unless otherwise specified, when used in the context of system(s) or device(s) that communicate information or data, the term "network" (e.g., the networks 105 and 440) refers to a collection of nodes (e.g., devices or systems capable of sending, receiving or forwarding information) and links which are connected to enable telecommunication between the nodes.

Each of the described networks may include dedicated routers responsible for directing traffic between nodes, and, in certain examples, dedicated devices responsible for configuring and managing the network. Some or all of the nodes may be also adapted to function as routers in order to direct traffic sent between other network devices. Network devices may be inter-connected in a wired or wireless manner, and network devices may have different routing and transfer capabilities. For example, dedicated routers may be capable of high volume transmissions while some nodes may be capable of sending and receiving relatively little traffic over the same period of time. Additionally, the connections between nodes on a network may have different throughput capabilities and different attenuation characteristics. A fiberoptic cable, for example, may be capable of providing a bandwidth several orders of magnitude higher than a wireless link because of the difference in the inherent physical limitations of the medium. If desired, each described network may include networks or sub-networks, such as a local area network (LAN) or a wide area network (WAN).

Node according to some embodiments: Generally speaking, the term "node" refers to a connection point, redistribution point, or a communication endpoint. A node may be any device or system (e.g., a computer system) capable of sending, receiving or forwarding information. For example, end-devices or end-systems that originate or ultimately receive a message are nodes. Intermediary devices that receive and forward the message (e.g., between two end-devices) are also generally considered to be "nodes."

Processor according to some embodiments: The various operations of example methods described herein may be performed, at least partially, by one or more processors (e.g., the one or more processors in the processor unit 142). Generally speaking, the terms "processor" and "microprocessor" are used interchangeably, each referring to a computer processor configured to fetch and execute instructions stored to memory. By executing these instructions, the processor(s) can carry out various operations or functions defined by the instructions. The processor(s) may be temporarily configured (e.g., by instructions or software) or permanently configured to perform the relevant operations or functions (e.g., a processor for an Application Specific Integrated Circuit, or ASIC), depending on the particular embodiment. A processor may be part of a chipset, which may also include, for example, a memory controller or an I/O controller. A chipset is a collection of electronic components in an integrated circuit that is typically configured to provide I/O and memory management functions as well as a plurality of general purpose or special purpose registers, timers, etc. Generally speaking, one or more of the described processors may be communicatively coupled to other components (such as memory devices and I/O devices) via a system bus.

The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Although specific embodiments of the present disclosure have been described, it will be understood by those of skill in the art that there are other embodiments that are equivalent to the described embodiments. Accordingly, it is to be understood that the present disclosure is not to be limited by the specific illustrated embodiments.

What is claimed is:

1. A smart ring comprising:
a housing configured to be worn by a user;
a power source disposed within the housing;
a charging circuit disposed within the housing, wherein the charging circuit includes a harvesting element configured to charge the power source, and wherein the harvesting element is configured to harvest energy from a motion of a portion of the user wearing the housing; and
a device at least partially disposed within the housing, wherein the device is configured to draw energy from the power source.

2. The smart ring of claim 1, wherein:
the harvesting element comprises a piezoelectric harvesting element.

3. The smart ring of claim 1, wherein:
the harvesting element comprises an induction coil.

4. The smart ring of claim 3, wherein:
the induction coil includes one or more turns along a circumference of a ring-shaped housing.

5. The smart ring of claim 1, wherein:
the harvesting element includes one or more additively manufactured components.

6. The smart ring of claim 1, wherein:
the motion of the portion of the user comprises an arm swing.

7. The smart ring of claim 1, wherein:
the harvesting element is configured to vibrate or oscillate in response to the motion of the portion of the user wearing the housing.

8. A smart ring comprising:
a means for housing, wherein the means for housing is configured to be worn by a user;
a means for powering, wherein the means for powering is disposed within the means for housing;
a means for charging disposed within the means for housing, wherein the means for charging includes a means for harvesting configured to charge the means for powering, and wherein the means for harvesting is configured to harvest energy from a motion of a portion of the user wearing the housing; and
a means for drawing energy from the means for powering, wherein the means for drawing energy from the means for powering is at least partially disposed within the means for housing.

9. The smart ring of claim 8, wherein:
the means for harvesting is a means for harvesting piezoelectric energy.

10. The smart ring of claim 8, wherein:
the means for harvesting comprises an induction coil.

11. The smart ring of claim 10, wherein:
the induction coil includes one or more turns along a circumference of a ring-shaped housing.

12. The smart ring of claim 8, wherein:
the means for harvesting includes one or more additively manufactured components.

13. The smart ring of claim 8, wherein:
the motion of the portion of the user comprises an arm swing.

14. A method for operating a smart ring, the method comprising:
generating electrical energy at a charging circuit within the smart ring, wherein the charging circuit includes a harvesting element, and wherein the harvesting element is configured to harvest energy from a motion of a portion of a user wearing the smart ring;
charging a power source disposed within the smart ring by delivering the electrical energy from the charging circuit to the power source; and
causing the power source to provide power to a device disposed within the smart ring.

15. The method of claim 14, wherein:
the harvesting element comprises a piezoelectric harvesting element.

16. The method of claim 14, wherein:
the harvesting element comprises an induction coil.

17. The method of claim 16, wherein:
the induction coil includes one or more turns along a circumference of the smart ring.

18. The method of claim 14, wherein:
the harvesting element includes one or more additively manufactured components.

19. The method of claim 14, wherein:
the motion of the portion of the user comprises an arm swing.

20. The method of claim 14, wherein:
the harvesting element is configured to vibrate or oscillate in response to the motion of the portion of the user wearing the smart ring.

\* \* \* \* \*